(12) United States Patent
Iwai et al.

(10) Patent No.: US 7,609,071 B2
(45) Date of Patent: Oct. 27, 2009

(54) HUMAN PHANTOM APPARATUS, FINGER PHANTOM APPARATUS, AND APPARATUS FOR MEASURING CHARACTERISTIC OF ANTENNA USING THE SAME PHANTOM APPARATUS

(75) Inventors: Hiroshi Iwai, Katano (JP); Atsushi Yamamoto, Osaka (JP); Koichi Ogawa, Hirakata (JP)

(73) Assignee: Panasonic Corporation, Osaka (JP)

( * ) Notice: Subject to any disclaimer, the term of this patent is extended or adjusted under 35 U.S.C. 154(b) by 969 days.

(21) Appl. No.: 10/790,857

(22) Filed: Mar. 3, 2004

(65) Prior Publication Data
US 2004/0235541 A1   Nov. 25, 2004

(30) Foreign Application Priority Data
Mar. 3, 2003   (JP) ............................ P2003-055519

(51) Int. Cl.
*G01R 27/32* (2006.01)
*G21K 1/12* (2006.01)
(52) U.S. Cl. ...................... 324/632; 324/628; 250/252.1
(58) Field of Classification Search ................. 324/628, 324/632
See application file for complete search history.

(56) References Cited
U.S. PATENT DOCUMENTS
5,236,385 A * 8/1993 May ............................ 446/300
5,789,929 A    8/1998 Hankui 2005/0077459 A1 * 4/2005 Engler et al. ............. 250/252.1

FOREIGN PATENT DOCUMENTS
| EP | 0 970 988 | 1/2000 |
| JP | 2790103 | 6/1998 |
| JP | 2000-82333 | 3/2000 |
| JP | 2002-107396 | 4/2002 |

OTHER PUBLICATIONS

Ogawa, K., et al. entitled "*A High-Precision Real Human Phantom for EM Evaluation of Handheld Terminals in a Talk Situation*", IEEE Antennas and Propagation Society International Symposium. 2001 Digest. APS. Boston, MA, Jul. 8-13, 2001, New York, NY: IEEE, US, vol. 1 of 4, Jul. 8, 2001, pp. 68-71, XP010564033.

(Continued)

*Primary Examiner*—Diego Gutierrez
*Assistant Examiner*—John Zhu
(74) *Attorney, Agent, or Firm*—Wenderoth, Lind & Ponack, L.L.P.

(57) ABSTRACT

A human phantom apparatus is provided with a body section, a head section connected with the body section, at least one shoulder section connected with the body section, and an arm section including a hand section, the arm section connected with the shoulder section. Each of the body section, the head section, the at least one shoulder section, and the arm section is filled with a human body equivalent material. The human phantom apparatus has a so-called PDA (Portable Digital Assistance) attitude of holding a radio communication apparatus by the hand section of the arm section, so that the human phantom apparatus looks at a display unit of the radio communication apparatus in front of the body section.

2 Claims, 26 Drawing Sheets

FIRST PREFERRED EMBODIMENT

SECOND PREFERRED EMBODIMENT

OTHER PUBLICATIONS

N. Kuster et al., entitled *"Energy Absorption Mechanism", by Biological Bodies in the Near Field of Dipole Antennas Above 300 MHZ*, IEEE Transaction on Vehicular Technology, vol. 41, No. 1, pp. 17-23, Feb. 1992.

*"Standard of Specific Absorption Rate Measurement Method of Portable Radio Terminal"*, issued by Association of Radio Industries and Business in Japan, ARIB STB-T56 Ver. 2.0, revised on Jan. 24, 2002.

Bernhard Rosenberger, entitled *"Miniature Dielectric-loaded Personal Telephone Antennas with Low SAR"*, Radio and Wireless Conference, 1998, Rawcon 98, IEEE Colorado Springs, Colorado, USA, Aug. 9, 1998, pp. 103-108.

Yoshio Koyanagi et al., entitled *"Estimation of the Radiation and SAR Characteristics of the NHA at 150 MHz by Use of the Cylindroid Whole Body Phantom"*, IEEE Antennas and Propagation Society International Symposium, 2001, Digest, APS, Boston, Massachusetts, USA, Jul. 8, 2001, New York, vol. 1 of 4, pp. 78-81.

Pedersen, G., et al., entitled *"Radiation Efficiency of Handheld Phones"*, VTC 2000-Spring. 2000 IEEE 51st. Vehicular Technology Conference Proceedings. Tokyo, Japan, May 15-18, 2000, IEEE Vehicular Technology Conference, New York, NY: IEEE, US, vol. 2 of 3, Conf. 51, 15, 2000, pp. 1381-1385, XP000968096.

Ogawa K., et al., entitled *"An Analysis of the Performance of a Headset Diversity Antenna Influenced by Head, Hand, and Shoulder Effects at 900 MHZ. I. Effective Gain Characteristics"*, IEEE Trans. Veh. Technol. (USA), IEEE Transactions on Vehicular Technology, May 2001, IEEE, USA, vol. 50, No. 3, May 2001, pp. 803-844, XP002292138.

\* cited by examiner

FIRST PREFERRED EMBODIMENT

MODIFIED PREFERRED EMBODIMENT OF FIRST PREFERRED EMBODIMENT

FIRST IMPLEMENTAL EXAMPLE

SECOND IMPLEMENTAL EXAMPLE

THIRD PREFERRED EMBODIMENT

MODIFIED PREFERRED EMBODIMENT OF
THIRD PREFERRED EMBODIMENT

FOURTH PREFERRED EMBODIMENT

HUMAN PHANTOM APPARATUS, FINGER PHANTOM APPARATUS, AND APPARATUS FOR MEASURING CHARACTERISTIC OF ANTENNA USING THE SAME PHANTOM APPARATUS

BACKGROUND OF THE INVENTION

1. Field of the Invention

The present invention relates to a human phantom apparatus, a finger phantom apparatus, an apparatus for measuring a characteristic of an antenna using the phantom apparatus, an antenna apparatus, and a radio communication apparatus with the antenna apparatus. In particular, the present invention relates to a human phantom apparatus and a finger phantom apparatus which are used upon measuring a characteristic of an antenna apparatus, an apparatus for measuring a characteristic of an antenna apparatus using the same phantom apparatus, an antenna apparatus constituted based on measurement results of the apparatus for measuring the characteristic of the antenna apparatus, and a radio communication apparatus using the antenna apparatus.

2. Description of the Related Art

In recent years, mobile communication systems, each using a radio communication apparatus such as a mobile phone or the like have been rapidly developed. Generally, the mobile phone is used in the vicinity of a human body, and therefore, it is important to highly accurately measure characteristics of an antenna of the mobile phone, in such a state that the mobile phone is attached to the human body. A conventional measurement of the characteristics of the antenna of the mobile phone has the following disadvantages. Since it has been difficult for a human subject to maintain his or her attitude, reproducibility is deteriorated. Due to great differences among human subjects, it is difficult to relatively compare measurement results with each other. For these reasons, the characteristics of the antenna of the mobile phone have been conventionally measured using a human phantom apparatus as disclosed in, for example, a first patent document of Japanese patent laid-open publication No. JP-P2000-082333-A, and a second patent document of Japanese patent laid-open publication No. JP-P2002-107396-A.

According to the first patent document, for example, in order to provide a composite dielectric capable of mass-producing solid biological phantoms in short time at a lower manufacturing cost, and having uniformly stable electric characteristics, the composite dielectric used for a solid biological phantom is characterized by containing thermosetting resin of 40 to 90 volume % and electrically conductive powder of 10 to 60 volume % (100 volume % in all).

According to the second patent document, for example, in order to measure the change in the characteristics due to a positional relationship between the antenna attached with the mobile phone and the human body or an ear, in particular, with higher accuracy, there is provided a human phantom apparatus that is constructed by a head section including ear sections, a body section, an arm section, a left hand section, and a moving means, and the human phantom is characterized by allowing the arm section to move by the moving means. The second patent document particularly provides the human phantom apparatus having an attitude for holding the mobile phone on the ear of the human phantom apparatus.

The mobile phone is used as a conventional telephone, and further, the mobile phone is also used as a data terminal for transmitting and receiving E-mails and viewing web pages using WWW (Word Wide Web). The frequency increases of using the mobile phone in a user's attitude of holding the mobile phone by his hand in front of his chest. This attitude is referred to as a PDA (Personal Digital Assistance) attitude hereinafter. In order to establish a higher quality of telephone speech communication quality of the mobile phone even in these circumstances, it is necessary to measure the characteristics of the antenna of the mobile phone with higher accuracy in accordance with the positional relationship between the antenna and the human body.

As disclosed by the second patent document, the conventional human phantom apparatus simulates an attitude in telephone speech communication of holding the mobile phone near the ear on the side of the head section, and is unable to measure the characteristics of the antenna in a PDA attitude. In the PDA attitude, the distance between the antenna of the mobile phone and the human body is larger than that that in the conventional attitude of the telephone speech communication. For this reason, it is disadvantageously difficult to highly accurately measure the characteristics of the antenna using the human phantom apparatus different from an actual human body in shapes of sections such as a shoulder, a chest, and an arm, in such a state that a radio wave radiated from a portable radio communication apparatus held in the PDA attitude is reflected and absorbed by the human phantom apparatus.

In addition, since the human phantom apparatus includes a solid material such as composite dielectric or the like, it is disadvantageously difficult to highly accurately simulate a state of the adhesion between fingers and the mobile phone, in such a state that the human phantom apparatus holds the mobile phone. The electric characteristics of the human body change according to the radio frequency being used. In order to deal with this change, it is necessary to manufacture the human phantom apparatus by re-adjusting the composition ratio of the solid materials according to the radio frequency band. As a result, the manufacturing cost disadvantageously increases.

Further, there has been desired a radio communication apparatus that includes at least two antennas, that performs diversity reception, and that can receive radio signals satisfactorily at levels larger than those of the prior art.

SUMMARY OF THE INVENTION

It is an object of the present invention to provide a human phantom apparatus, a finger phantom apparatus, and an antenna characteristic measurement apparatus using the human phantom apparatus and the finger phantom apparatus capable of solving the above-mentioned conventional disadvantages, holding a radio communication apparatus such as a mobile phone or the like in a PDA attitude, and measuring a characteristic of an antenna of the radio communication apparatus with accuracy higher than that of the prior art.

It is another object of the present invention to provide an antenna apparatus capable of solving the conventional disadvantages, and receiving a radio signal satisfactorily based on measurement results of the antenna characteristic measurement apparatus for use in a radio communication apparatus that includes at least two antennas and performs diversity reception, and a radio communication apparatus using the antenna apparatus.

According to one aspect of the present invention, there is provided a human phantom apparatus with a body section, a head section connected with the body section, at least one shoulder section connected with the body section, and an arm section including a hand section. The arm section is connected with the shoulder section. Each of the body section, the head section, the at least one shoulder section, and the arm section is filled with a human body equivalent material. The human phantom apparatus has an attitude of holding a radio communication apparatus by the hand section of the arm section, so that the human phantom apparatus looks at a display unit of the radio communication apparatus in front of the body section.

In the above-mentioned human phantom apparatus, the head section is preferably arranged to be inclined from a vertical direction of the human phantom apparatus.

The above-mentioned human phantom apparatus preferably further includes a first rotational connecting device which rotatably connects the head section on the body section at a depression angle direction of the human phantom apparatus.

The above-mentioned human phantom apparatus preferably further includes a second rotational connecting device which rotatably connects the hand section around the arm section at the depression angle direction of the human phantom apparatus so as to change an inclined angle of the radio communication apparatus with respect to a horizontal direction.

The above-mentioned human phantom apparatus preferably further includes a first slidable connecting device which slidably connects the shoulder section with the arm section so as to change an interval between the body section and the hand section.

The above-mentioned human phantom apparatus preferably further includes a second slidable connecting device which slidably connects the shoulder section with the body section substantially in a vertical direction of the human phantom apparatus.

In the above-mentioned human phantom apparatus, the human phantom apparatus is preferably employed to measure a characteristic of an antenna of the radio communication apparatus.

According to another aspect of the present invention, there is provided a finger phantom apparatus which includes a hollow fingertip section made of an elastic material, and a hollow finger root section made of a dielectric material. The fingertip section and the finger root section are filled with a human body equivalent material, and are sealed.

According to a further aspect of the present invention, there is provided a finger phantom apparatus which includes a hollow fingertip section made of an elastic material, and a finger root section made of a solid phantom. The finger section is filled with a human body equivalent material.

In the above-mentioned finger phantom apparatus, the finger phantom apparatus is preferably employed to measure a characteristic of an antenna of a radio communication apparatus.

According to a still further aspect of the present invention, there is provided an antenna characteristic measurement apparatus which measures a characteristic of an antenna of the radio communication apparatus using the human phantom apparatus. The antenna characteristic measurement apparatus includes a control device. The control device measures the characteristic of the antenna of the radio communication apparatus, by changing at least one parameter selected from (a) an interval between the body section and the radio communication apparatus, (b) an inclined angle of the radio communication apparatus with respect to a horizontal direction, and (c) a height of the radio communication apparatus.

In the above-mentioned antenna characteristic measurement apparatus, the human phantom apparatus preferably includes the finger phantom apparatus.

In the above-mentioned antenna characteristic measurement apparatus, the characteristic of the antenna of the radio communication apparatus are preferably measured in such a state that the fingertip section is brought into contact with an input device of the radio communication apparatus.

According to a still further aspect of the present invention, there is provided an antenna apparatus for use in a radio communication apparatus. The antenna apparatus includes at least two antennas. The two antennas are arranged in the radio communication apparatus, so that an absolute value d0 of a horizontal interval between the two antennas satisfies the following Equation:

$$d0 = \lambda/4 + (n\lambda)/2,$$

where $\lambda$ is a wavelength of a radio wave to be used, and n is an integer equal to or larger than zero.

According to a still further aspect of the present invention, there is provided an antenna apparatus for use in a radio communication apparatus. The antenna apparatus includes at least two antennas. The two antennas are arranged in the radio communication apparatus, so that an absolute value d0 of a horizontal interval between the two antennas, in such a state that the radio communication apparatus is inclined at a predetermined inclined angle with respect to a horizontal direction, satisfies the following Equation:

$$d0 = \lambda/4 + (n\lambda)/2,$$

where $\lambda$ is a wavelength of a radio wave to be used, and n is an integer equal to or larger than zero.

According to a further aspect of the present invention, there is provided a radio communication apparatus which includes the above-mentioned antenna apparatus.

According to a still further aspect of the present invention, there is provided an antenna apparatus for use in a radio communication apparatus. The antenna apparatus includes at least two antennas including a first antenna and a second antenna. The first and second antennas are arranged in the radio communication apparatus, so that an absolute value d0 of a difference between (a) a horizontal interval between the body section of the human phantom apparatus and the first antenna and (b) a horizontal interval between the body section of the human phantom apparatus and the second antenna, in such a state that the radio communication apparatus is held by the hand section of the human phantom apparatus satisfies the following Equation:

$$d0 = \lambda/4 + (n\lambda)/2,$$

where $\lambda$ is a wavelength of a radio wave to be used, and n is an integer equal to or larger than zero.

According to a still further aspect of the present invention, there is provided an antenna apparatus for use in a radio communication apparatus. The antenna apparatus includes at least two antennas including a first antenna and a second antenna. The first and second antennas are arranged in the radio communication apparatus, so that an absolute value d0 of a difference between (a) a horizontal interval between the body section of the human phantom apparatus and the first antenna and (b) a horizontal interval between the body section of the human phantom apparatus and the second antenna, in such a state that the radio communication apparatus is held so as to be inclined at a predetermined inclined angle with respect to a horizontal direction by the hand section of the human phantom apparatus satisfies the following Equation:

$$d0 = \lambda/4 + (n\lambda)/2,$$

where $\lambda$ is a wavelength of a radio wave to be used, and n is an integer equal to or larger than zero.

According to a still further aspect of the present invention, there is provided a radio communication apparatus which includes the above-mentioned antenna apparatus.

Accordingly, it is possible to faithfully simulate such a state that the radio communication apparatus is held in a PDA attitude, and to measure the characteristics of the antenna with accuracy higher than that of the prior art by measuring an antenna of the radio communication apparatus using the human phantom apparatus.

Further, by designing dimensions of inner walls of respective sections of the human phantom apparatus based on standard dimensions of an adult male according to predetermined statistic data, it is possible to measure the characteristics of the antenna of the radio communication apparatus having larger universality.

The human phantom apparatus is provided as a liquid phantom having a physiological saline solution, water, or an SAR solution filled into a dielectric container made of resin or the like. In this case, even if antenna measurement should be done for various radio frequencies, the characteristics of the antenna of the radio communication apparatus 111 can be measured only by filling a physiological saline solution, water, or an SAR solution according to electric properties of a human body for the respective radio frequencies. In addition, it is possible to greatly reduce a manufacturing cost as compared with that of a solid phantom made of a solid material.

By making a position and an angle at which the radio communication apparatus is held adjustable by the sliding mechanism, it is possible to measure radiation characteristics of the antenna using the interval between the radio communication apparatus and the human phantom apparatus and the inclined angle of the radio communication apparatus as parameters. In addition, the attitude of the display unit of the radio communication apparatus can be adjusted to always face or oppose the head section of the human phantom apparatus, so that the human phantom apparatus looks at the display unit. Therefore, it is possible to measure the characteristics of the antenna of the radio communication apparatus with accuracy higher than that of the prior art.

Further, when a plurality of antennas are arranged in the radio communication apparatus, they are arranged so that an absolute value of the difference between intervals "d1" and "d2" between the antennas and the body section of the human phantom apparatus, respectively, is $\lambda/4$ or a value obtained by adding a multiple of a natural number of $\lambda/2$ to $\lambda/4$, in such a state that the radio communication apparatus is held so as to be inclined at a predetermined inclined angle, and further, the antenna having a higher reception level in a propagation environment within a line of sight is selected as a transmission antenna. Then it is possible to improve a space diversity effect and to suppress deterioration of antenna sensitivity in the PDA attitude.

Moreover, by employing the finger phantom apparatus having a container a tip end portion of which is made of an elastic material such as rubber, it is possible to highly accurately simulate such a state that a finger contacts with the antenna or the radio communication apparatus, and to measure the characteristics of the antenna with accuracy higher than that of the prior art.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
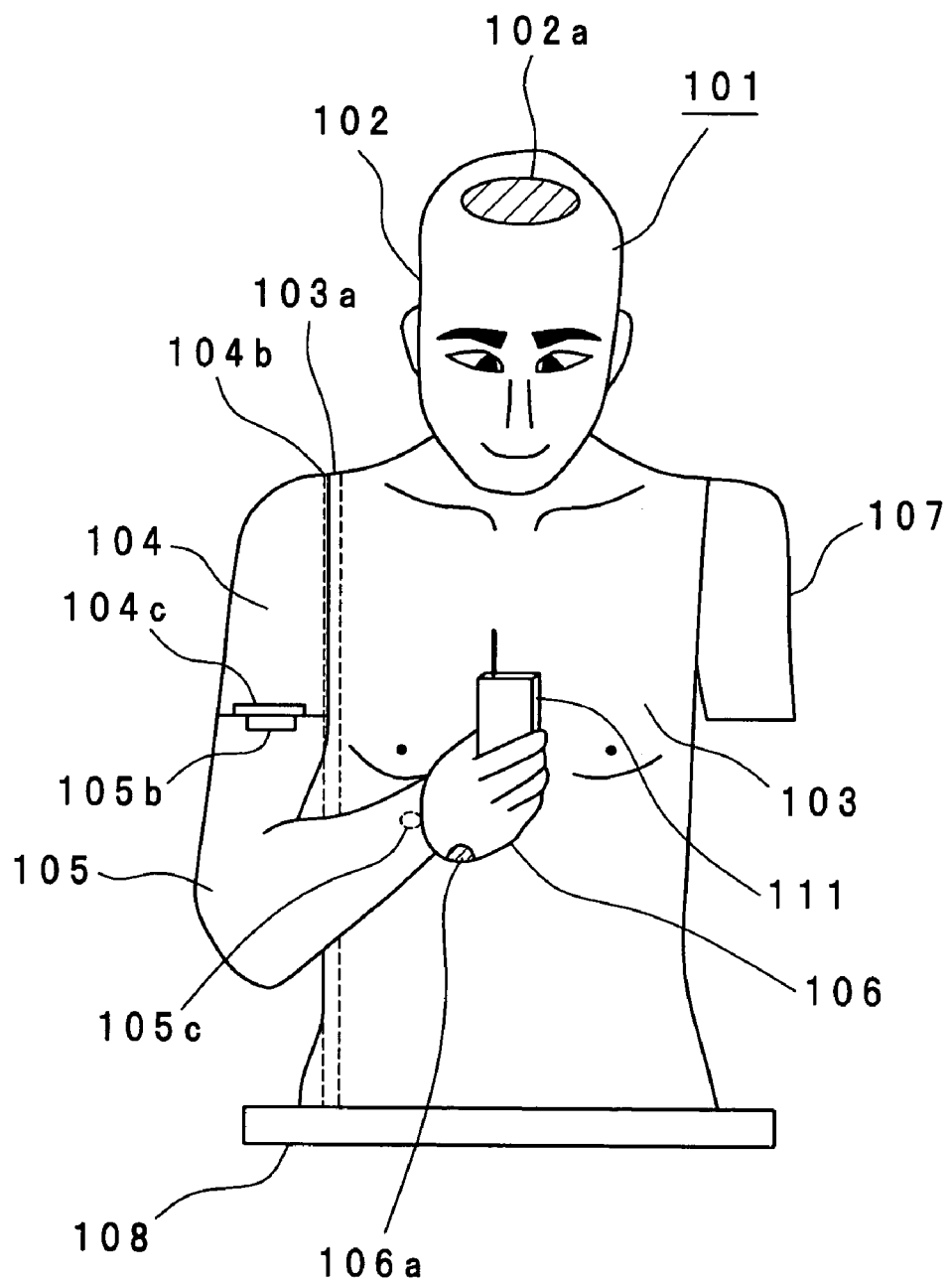
FIG. 1 is a front view which illustrates a configuration of a human phantom apparatus 101 according to a first preferred embodiment of the present invention.

Preferred embodiments according to the present invention will be described below with reference to the attached drawings. The same reference numerals are used for components similar to each other.

First Preferred Embodiment

Figure 2:
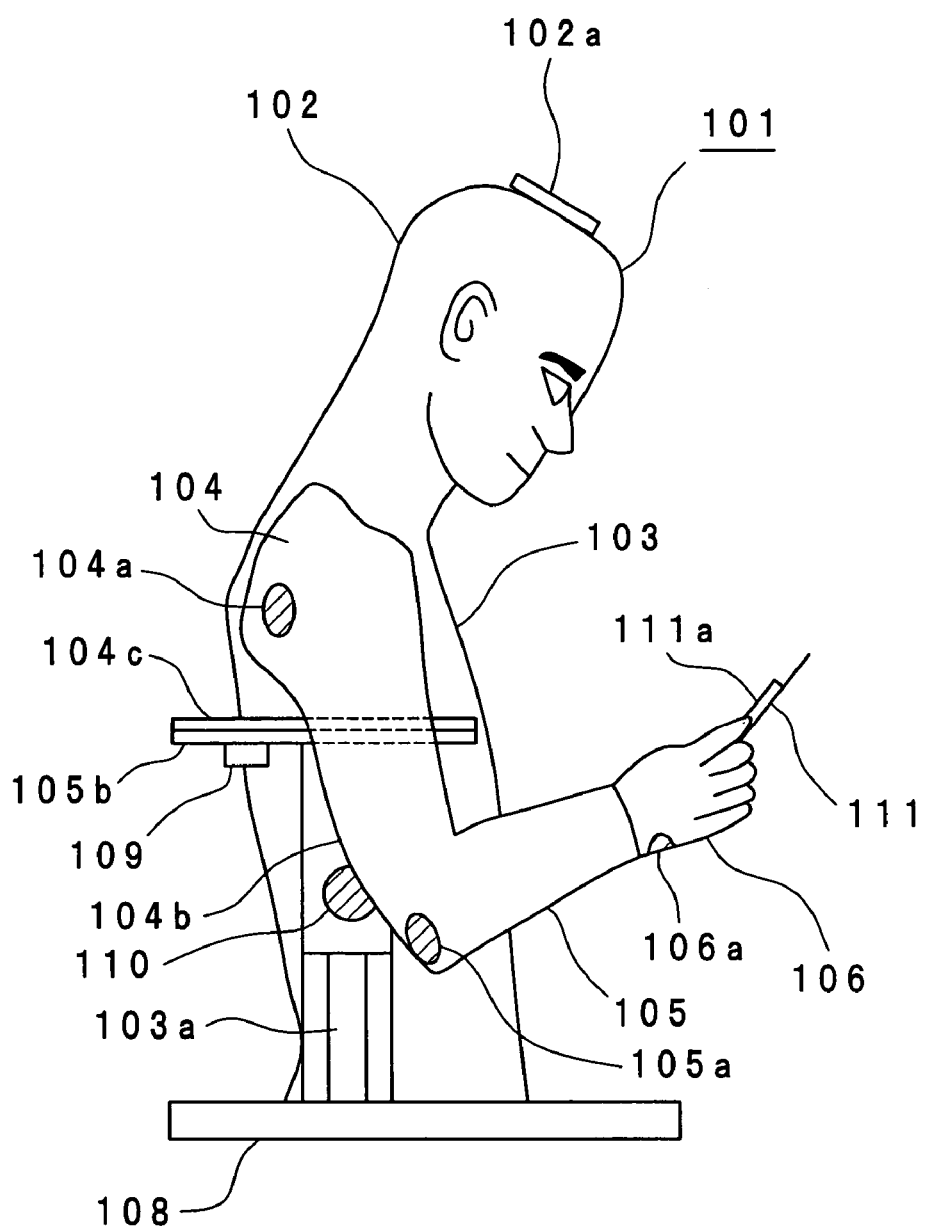
FIG. 2 is a side view which illustrates a configuration of the human phantom apparatus 101 shown in FIG. 1.
Figure 3:
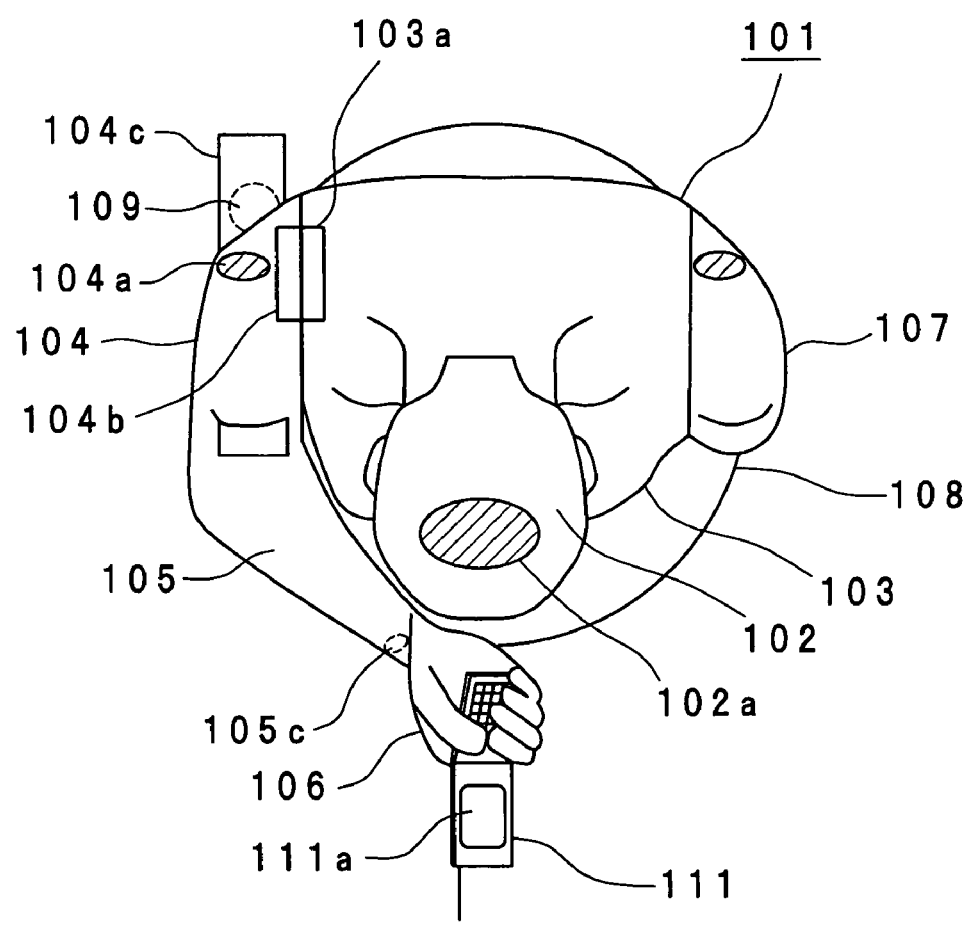
FIG. 3 is a top view which illustrates a configuration of the human phantom apparatus 101 shown in FIG. 1.

FIG. 1 is a front view which illustrates a configuration of a human phantom apparatus 101 according to the first preferred embodiment of the present invention. FIG. 2 is a side view which illustrates a configuration of the human phantom apparatus 101 shown in FIG. 1. FIG. 3 is a top view which illustrates a configuration of the human phantom apparatus 101 shown in FIG. 1.

As shown in FIGS. 1 to 3, the human phantom apparatus 101 according to the first preferred embodiment is characterized by including a head section 102, a body section 103, a right shoulder section 104, a left shoulder section 107, and a right arm section 105 connected with the right shoulder section 104 and having a right hand section 106. The human phantom apparatus 101 is characterized by having a PDA attitude of holding a portable radio communication apparatus 111 by the right hand section 106 of the right arm section 105 in front of the body section 103, so that the human phantom apparatus 101 looks down at a liquid crystal display unit 111a of the portable radio communication apparatus 111. In this case, the PDA attitude means an attitude of holding the portable radio communication apparatus 111 by the right hand section 106 in front of the chest of the body section 103 of the human phantom apparatus 101, so that the human phantom apparatus 101 can operate the portable radio communication apparatus 111 such as a PDA (Personal Digital Assistant) or the like upon looking at the liquid crystal display unit 111a thereof.

Referring to FIGS. 1 to 3, the body section 103 is formed integrally with a pedestal 108 so as to be mounted on the pedestal 108, and the head section 102 is formed integrally with the body section 103 so as to be mounted on the body section 103. The head section 102 is provided to be inclined from the vertical direction of the human phantom apparatus 101, which is parallel to the zenith direction, so that the human phantom apparatus 101 looks down at the liquid crystal display unit 111a of the portable radio communication apparatus 111, as described later in detail. The right shoulder section 104 is connected with an upper right side surface of the body section 103 through a shoulder section sliding mechanism including sliding sections 103a and 104b, so that the right shoulder section 104 is slidable and fixable substantially in the vertical direction, which is parallel to the up and down directions of the human phantom apparatus 101. In addition, the left arm section 107 is connected with an upper left side surface of the body section 103. By the sliding of the shoulder sliding mechanism including the sliding sections 103*a* and 104*b*, the height in the vertical direction of the hand section 106 that holds the portable radio communication apparatus 111 can be changed, so that the height of the portable radio communication apparatus 111 can be changed. Further, the right arm section 105 is connected with the right shoulder section 104 through an arm sliding mechanism that includes sliding sections 104*c* and 105*b*, so that the right arm section 105 is slidable and fixable in a horizontal direction which is parallel to the front and back direction or the back and forth direction of the human phantom apparatus 101. Further, the right hand section 106 is connected with a tip end of the right arm section 105 through a hand section rotation mechanism using a screw of a screw reception section 105*c*, so that the right hand section 106 is rotatable around an axis of the right arm section 105 in a depression angle direction, in which the human phantom apparatus 101 looks down at the liquid crystal display unit 111*a*.

The surfaces of the head section 102, the body section 103, the right shoulder section 104, the right arm section 105, the right hand section 106, and the left shoulder section 107 are made of resin such as FRP (Fiber Reinforced Plastics) or the like so as to have a thickness of 2 to 8 mm. A solution of a medium having an electric constant close to that of a human body (e.g., a physiological saline solution or water (when the used radio frequency is relatively low)) or an SAR solution, as a human body equivalent material, is injected and filled into interiors of the head section 102, the right shoulder section 104, the right arm section 105, and the right hand section 106 through injection holes 102*a*, 104*a*, 105*a*, and 106*a*, respectively. The head section 102 is formed integrally with the body section 103 and inside hollows thereof are communicated each other, so that the solution injected from the injection hole 102*a* of the head section 102 is also filled into the interior of the body section 103. The SAR solution is a solution used to measure an SAR (Specific Absorption Rate) that is an electric power absorbed by a unit mass due to exposure of a living body such as a human or the like to an electromagnetic field, and is used as the human body equivalent material. At a used radio frequency f of, for example, 900 MHz, the SAR solution preferably includes sucrose of 56.6%, demineralized water of 40.92%, sodium chloride of 1.48%, hydroxyl cellulose of 1.0%, and germicide of 0.1%. In addition, at a used radio frequency f of, for example, 1900 MHz, the SAR solution preferably includes butyl Carbitol of 44.92%, demineralized water of 54.90%, and sodium chloride of 0.18%. In the present specification, symbol % indicates percentage of a volume content. The injection hole 102*a* of the head section 102 is formed in a vertex section of the head section 102, and this leads to prevention of mixture of the air when the solution is injected into the human phantom apparatus 101.

Figure 4:
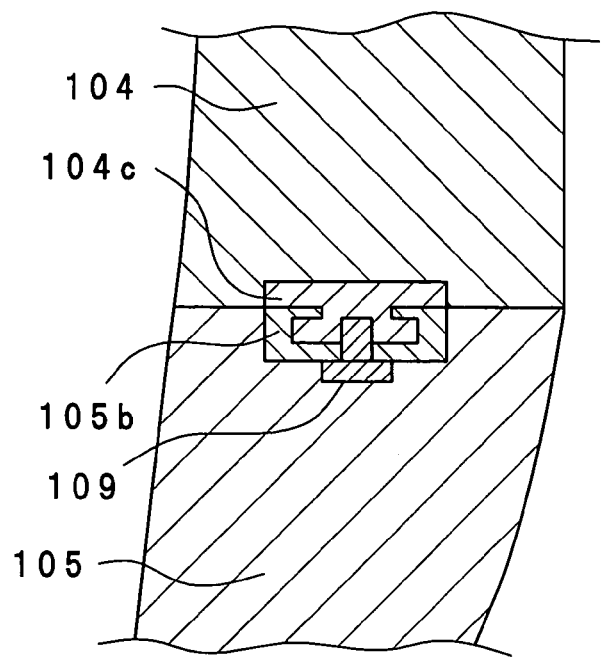
FIG. 4 is a longitudinal sectional view which illustrates a configuration in the vicinity of a portion in which a right shoulder section 104 and a right arm section 105 of the human phantom apparatus 101 shown in FIG. 1 are engaged with each other.
Figure 5:
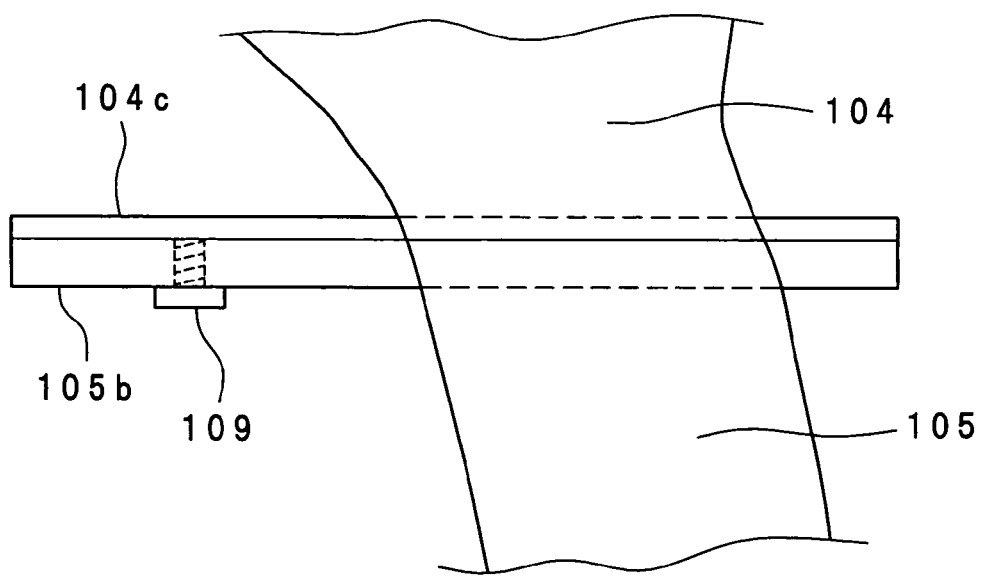
FIG. 5 is a side view which illustrates a configuration in the vicinity of the portion in which the right shoulder section 104 and the right arm section 105 of the human phantom apparatus 101 shown in FIG. 1 are engaged with each other.

FIG. 4 is a longitudinal sectional view which illustrates a configuration in the vicinity of a portion in which the right shoulder section 104 and the right arm section 105 of the human phantom apparatus 101 shown in FIG. 1 are engaged with each other. FIG. 5 is a side view which illustrates a configuration in the vicinity of the portion in which the right shoulder section 104 and the right arm section 105 of the human phantom apparatus 101 shown in FIG. 1 are engaged with each other.

Referring to FIG. 4, the right shoulder section 104 is formed integrally with the sliding section 104*c*, and the right arm section 105 is formed integrally with the sliding section 105*b*. The sliding section 104*c* is inserted and engaged with the sliding section 105*b*. In this case, the right arm section 105 including the sliding section 105*b* is constituted to slide in the front and back directions of the human phantom apparatus 101 relative to the right shoulder section 104 including the sliding section 104*c*. As shown in FIGS. 4 and 5, a screw 109 penetrating the sliding section 105*b* and received by the sliding section 104*c* can fix the right arm section 105 including the sliding section 105*b* onto the right shoulder section 104 including the sliding section 104*c*.

Further, the right shoulder section 104 including the sliding section 104*b* has a sliding mechanism similar to that of FIGS. 4 and 5 with respect to the body section 103 including the sliding section 103*a*. The right shoulder section 104 including the sliding section 104*b* slides in the vertical direction of the body section 103 including the sliding section 103*a*, and is fixed to the body section 103 including the sliding section 103*a* by a screw 110 of FIG. 2.

Figure 6:
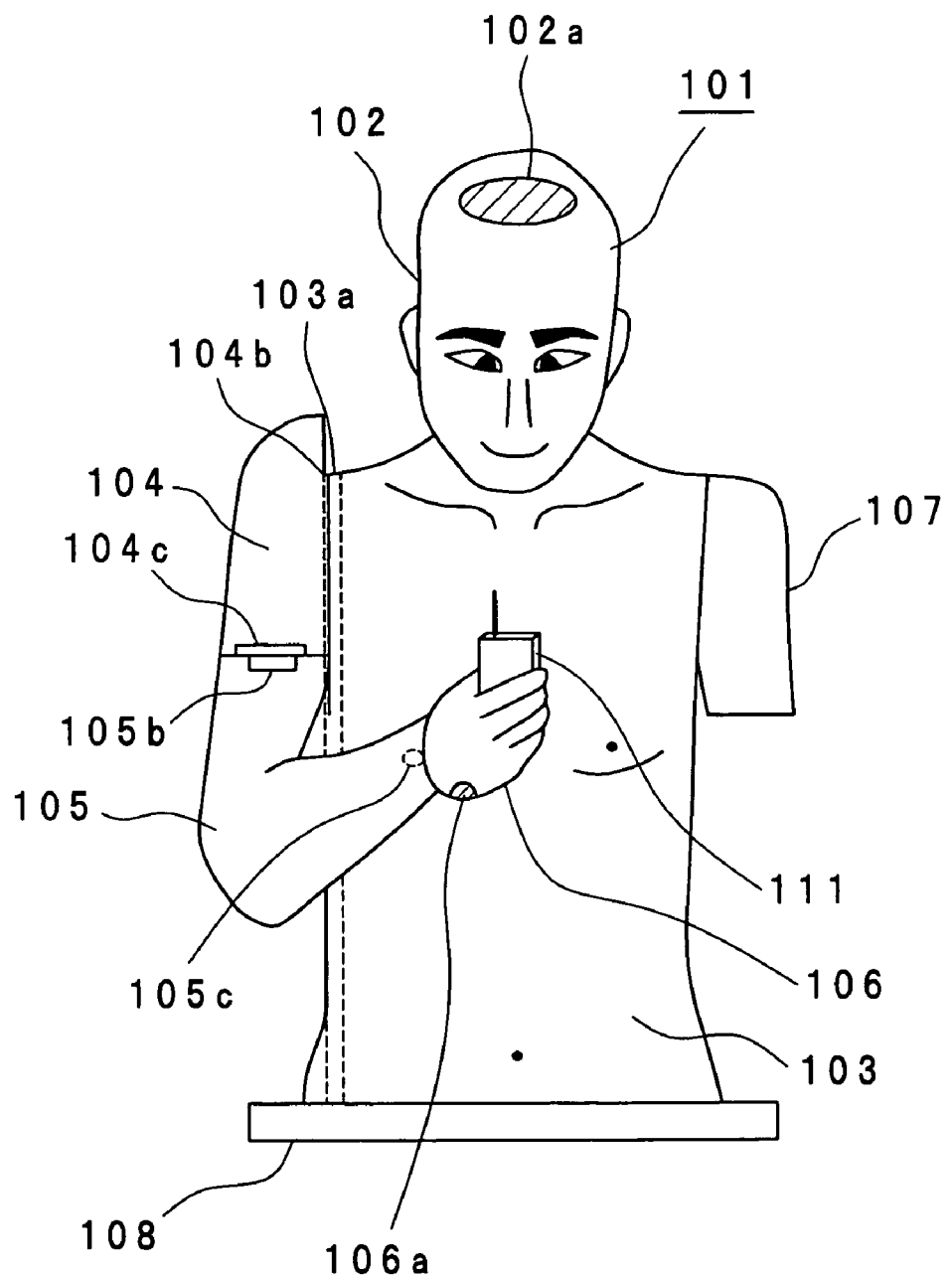
FIG. 6 is a front view which illustrates such a state that the right shoulder section 104 is moved upward, the right arm section 105 is moved backward, and a right hand section 106 is rotated so that the human phantom apparatus 101 looks down at a liquid crystal display unit 111a of a portable radio communication apparatus 111 at a low depression angle in the human phantom apparatus 101 shown in FIG. 1.
Figure 7:
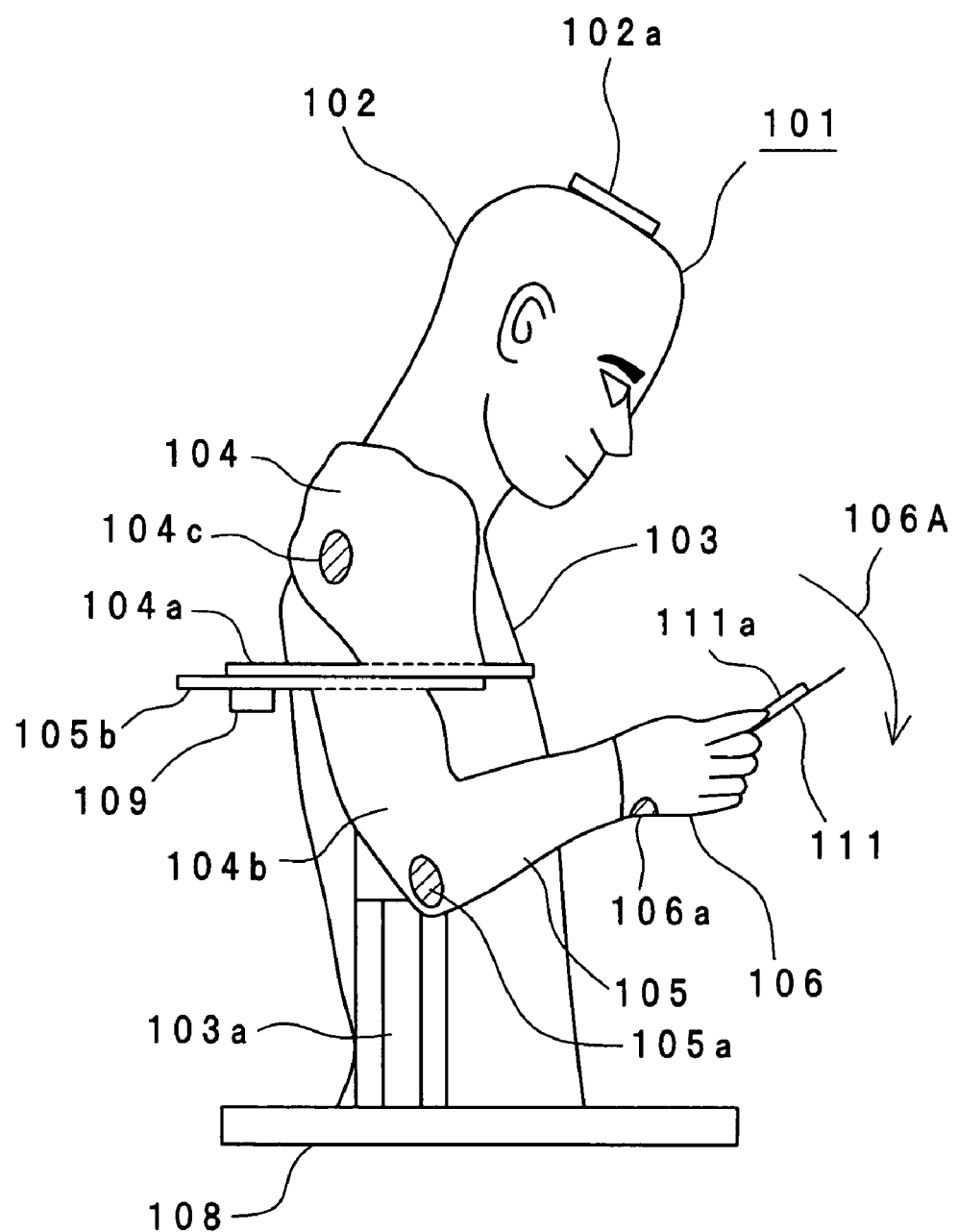
FIG. 7 is a side view which illustrates a state of the human phantom apparatus 101 shown in FIG. 6.
Figure 8:
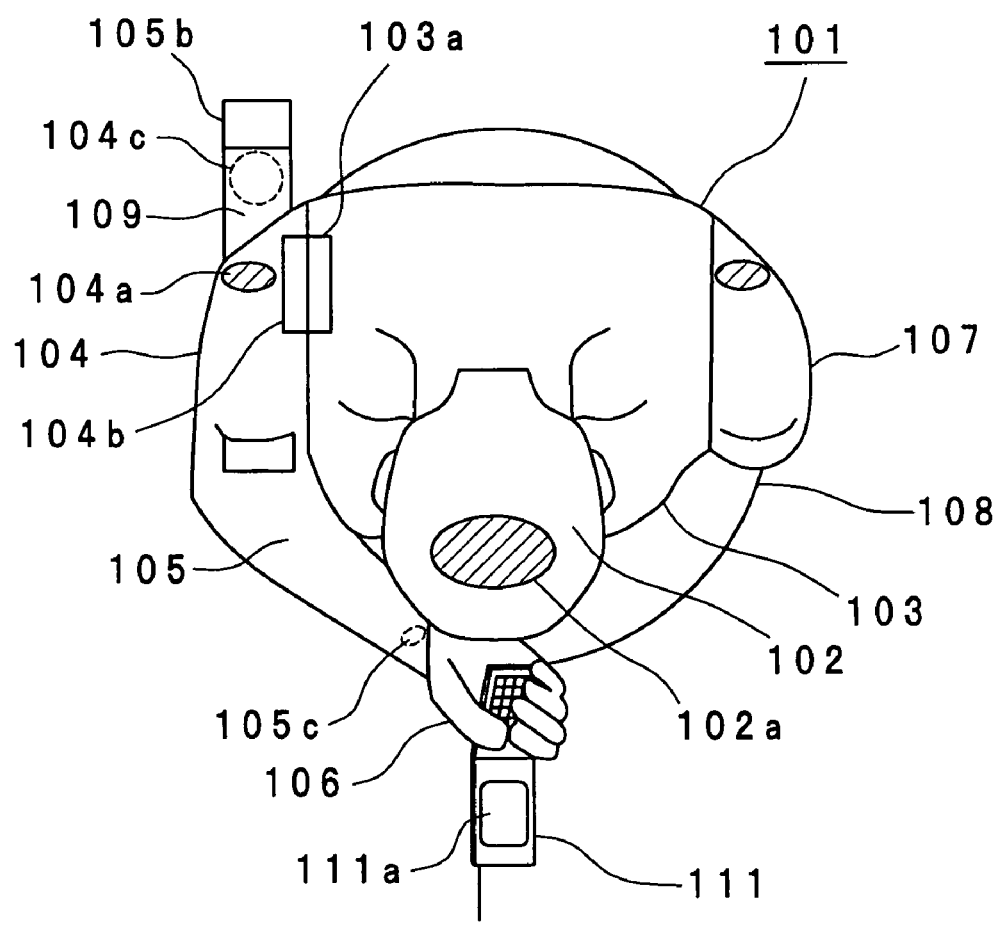
FIG. 8 is a top view which illustrates a state of the human phantom apparatus 101 shown in FIG. 6.

FIG. 6 is a front view which illustrates such a state that the right shoulder section 104 is moved upward, the right arm section 105 is moved backward, and the right hand section 106 is rotated so that the human phantom looks down at the liquid crystal display unit 111*a* of the portable radio communication apparatus 111 at a low depression angle in the human phantom apparatus 101 shown in FIG. 1. FIG. 7 is a side view which illustrates a state of the human phantom apparatus 101 shown in FIG. 6. FIG. 8 is a top view which illustrates a state of the human phantom apparatus 101 shown in FIG. 6.

As shown in FIGS. 6 to 8, a positional relationship among the portable radio communication apparatus 111, the head section 102, and the body section 103 can be easily adjusted. In this case, the sliding sections 103*a* and 104*b* serving as the shoulder sliding mechanism move the right shoulder section 104 upward, and the sliding sections 104*c* and 105*b* serving as the arm sliding mechanism move the right arm section 105 in the front direction of the human phantom apparatus 101. Further, the screw reception section 105*c* serving as a fingertip rotation mechanism rotates the right hand section 106*a* in a direction as indicated by an arrow 106A of FIG. 7, so that the human phantom apparatus 101 looks down at the liquid crystal display unit 111*a* of the portable radio communication apparatus 111 at the low depression angle. As a result, even if the user operates the portable radio communication apparatus 111 when making the portable radio communication apparatus 111 closer to his face, the liquid crystal display unit 111*a* of the portable radio communication apparatus 111 can be adjusted to have an angle at which the liquid crystal display unit 111*a* is visible relative to lines of eyes of the human phantom apparatus 101. In addition, the fingertip rotation mechanism can adjust the right hand section 106, so that the liquid crystal display unit 111*a* can always face or oppose to the head section 102.

The human phantom apparatus 101 constituted as mentioned above has the PDA attitude of holding the portable radio communication apparatus 111 by the right hand section 106 of the right arm section 105 in front of the body section 103, so that the human phantom apparatus 101 looks down at the liquid crystal display unit 111*a* that serves as a display unit of the portable radio communication apparatus 111, i.e., so that lines of the eyes of the human phantom apparatus 101 reach the liquid crystal display unit 111*a*. Therefore, the PDA attitude can be faithfully simulated, and the characteristics of the antenna of the portable radio communication apparatus 111 can be measured with accuracy higher than that of the prior art.

Furthermore, the human phantom is provided as a liquid phantom having the solution such as the physiological saline solution as filled into a dielectric container made of resin or the like. In this case, even if various radio frequencies are used, the characteristics of the antenna of the portable radio communication apparatus 111 can be similarly measured only by injecting and filling the solution according to the electric properties of the human body at the respective radio frequencies. Therefore, it is possible to remarkably reduce the manufacturing cost as compared with that of a solid phantom made of a solid material.

In the first preferred embodiment, the injection holes 102a, 104a, 105a, and 106a are formed in the respective components 102, 104, 105, and 106. However, the present invention is not limited to this, and for example, a plurality of injection holes may be formed in each of the components 102, 104, 105, and 106. This makes it is possible to facilitate discharging the solution filled into the interiors of these components 102, 104, 105, and 106. In this case, it is important to provide each injection hole at a position which does not influence the measurement results. That is, it is important to form each injection hole at a position at which a positional relationship that the solution is present between each injection hole and the portable radio communication apparatus 111 is satisfied. As shown in FIG. 2, for example, it is preferable that the injection hole 104a is formed in an upper side surface of the right shoulder section 104, and that the injection hole 105a is formed in a central side surface of the right arm section 105. It is also preferable to form a drainage hole (not shown) in a lower end portion of the back of the body section 103.

If the dimensions of the inner walls of the head section 102, the body section 103, the right shoulder section 104, the right arm section 105, the right hand section 106, and the left shoulder section 107 are designed based on standard dimensions of an adult male according to predetermined statistical data, it is possible to measure the characteristics of the antenna having a larger universality. By faithfully simulating an actual human body shape, it is possible to measure situations in which a radio wave radiated from the portable radio communication apparatus 111 as held in the PDA attitude is reflected and absorbed by the human phantom apparatus 101 with higher accuracy, and to measure an electromagnetic influence of the human body on the portable radio communication apparatus 111 with higher accuracy, than those of the prior art.

Modified Preferred Embodiment of First Preferred Embodiment

Figure 9:
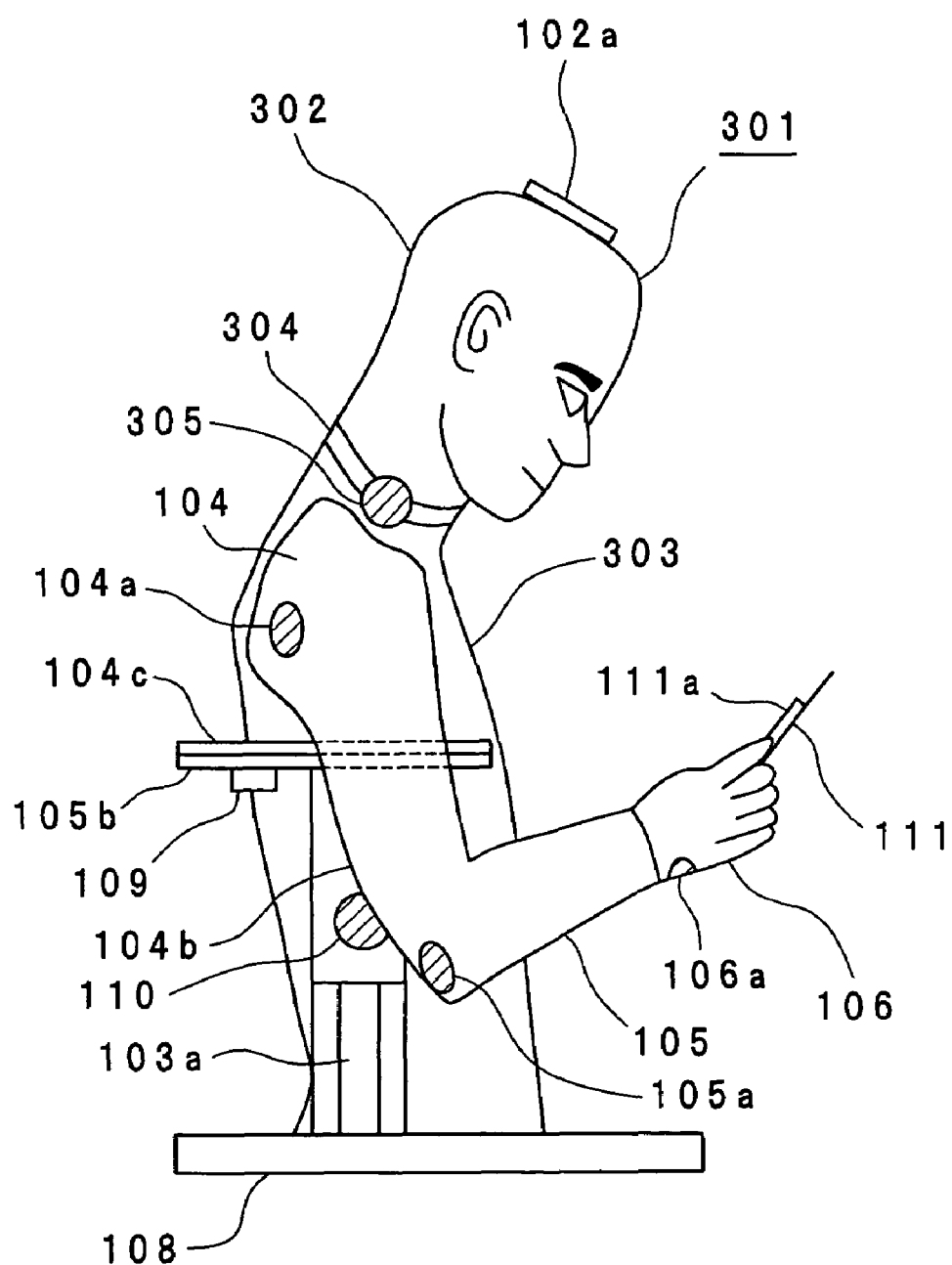
FIG. 9 is a front view which illustrates a configuration of a human phantom apparatus 301 according to a modified preferred embodiment of the first preferred embodiment of the present invention.
Figure 10:
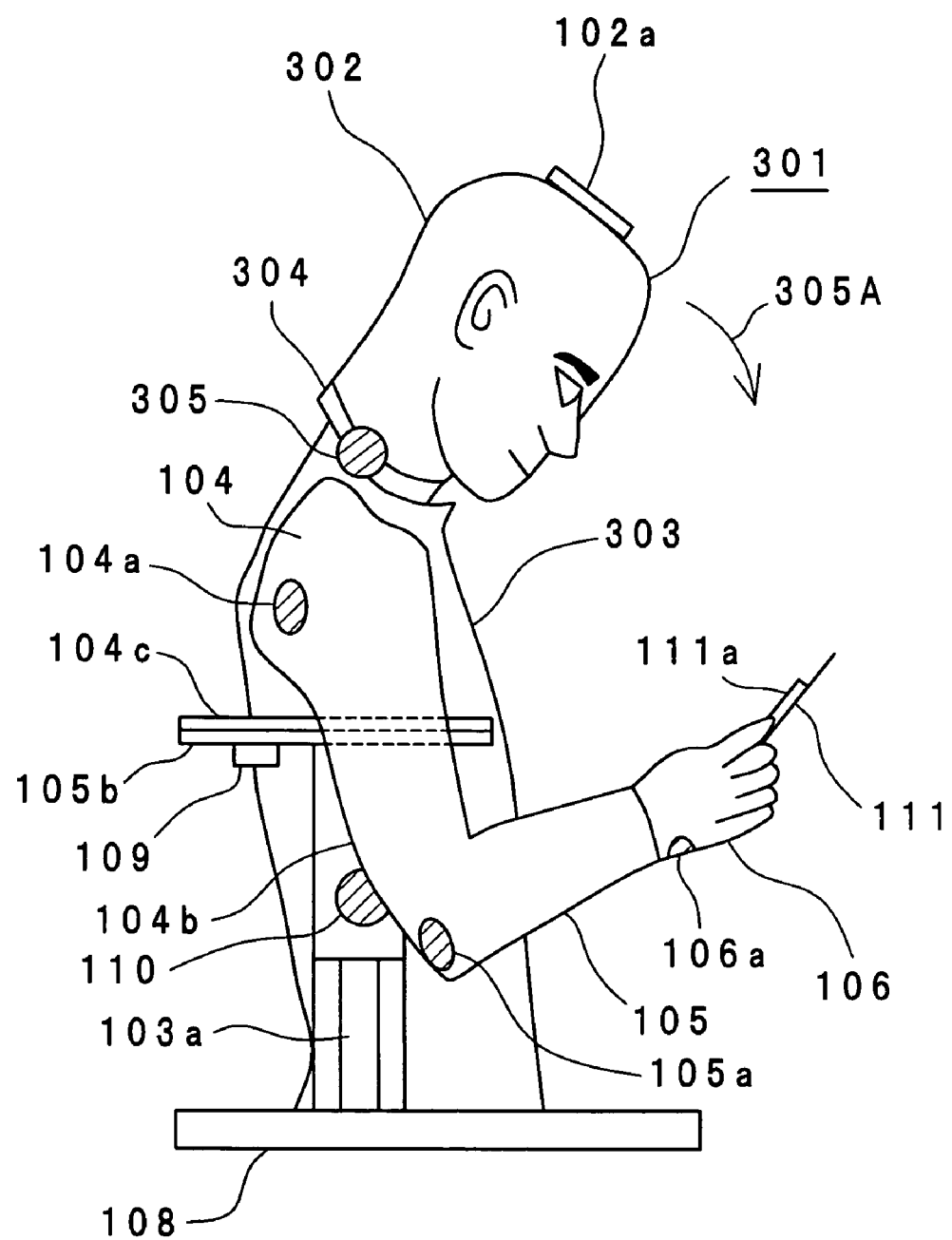
FIG. 10 is a side view which illustrates such a state that a head section 302 is caused to slide by a head section sliding and rotation mechanism to rotate the head section 302, so that the human phantom apparatus 301 looks down at a liquid crystal display unit 111a of a portable radio communication apparatus 111 in the human phantom apparatus 301 shown in FIG. 9.

FIG. 9 is a front view which illustrates a configuration of a human phantom apparatus 301 according to a modified preferred embodiment of the first preferred embodiment of the present invention. FIG. 10 is a side view which illustrates such a state that a head section 302 is caused to slide by a head section sliding and rotation mechanism to rotate the head section 302, so that a human phantom looks down at a liquid crystal display unit 111a of a portable radio communication apparatus 111 in the human phantom apparatus 301 shown in FIG. 9.

The human phantom apparatus 301 according to the modified preferred embodiment of the first preferred embodiment is constituted so that a head sliding mechanism is provided between the head section 302 and a body section 303 and is fixed by a screw section 305. This makes it possible for the head section 302 can be rotated in the front and back directions, as indicated by an arrow 305A, so as to slide on a circular concave portion of an upper end portion of the body section 303, and to orient or direct lines of eyes of the human phantom apparatus 301 to a downward direction. Then the lines of eyes of the human phantom apparatus 301 can be adjusted so as to oriented toward the front direction relative to the liquid crystal display unit 111a of the portable radio communication apparatus 111, and so that the human phantom apparatus 301 can look down at the liquid crystal display unit 111a. Therefore, the characteristics of the antenna can be measured with accuracy higher than that of the prior art.

In the preferred embodiment and the modified preferred embodiment thereof, there are described the human phantom apparatuses 101 and 301 each having the left and right shoulder sections 104 and 107. However, the present invention is not limited to this, and the human phantom apparatus may include at least one shoulder section so that a hand section of the shoulder section holds the portable radio communication apparatus 111.

In the preferred embodiment and the modified preferred embodiment thereof, the instance of holding the portable radio communication apparatus 111 by the right hand section 106 is described. However, the present invention is not limited to this. Alternatively, the human phantom apparatus may be constituted to further include a left arm section and a left hand section connected with the left shoulder section 107 or include only the left arm section and the left hand section which are connected with the left shoulder section 107, and to hold the portable radio communication apparatus 111 by the left hand section. Further, the portable radio communication apparatus 111 may be held by the right and left hand sections. In this case, similar sliding mechanisms are provided between the left shoulder section 107 and the body section 103 and between the left shoulder section 107 and the left arm section, respectively, and further, a rotational mechanism is provided between the left arm section and the left hand section.

In the preferred embodiment and the modified preferred embodiment thereof, the pedestal 108 is not necessarily provided. However, since the pedestal 108 can produce an effect of safety against overturning, the pedestal 108 is preferably provided as long as the pedestal 108 is large enough not to influence the characteristics of the antenna. Besides, a grip may be attached to the pedestal 108, and then, it is possible to facilitate moving the human phantom apparatus 101 or 301.

In the preferred embodiment and the modified preferred embodiment thereof, upper halves of the human phantom apparatuses 101 and 103 are provided, respectively. However, the present invention is not limited to this. As long as the human phantom apparatus includes at least the respective sections shown in the preferred embodiment and the modified preferred embodiment thereof, the human phantom apparatus may be a standing whole body model or a sitting whole body model.

In the preferred embodiment and the modified preferred embodiment thereof, the liquid phantom having the solution such as the solution of the medium having an electric constant close to that of the human body, e.g., the SAR solution injected into the interiors of the respective components is described. However, the present invention is not limited to this. The human phantom apparatus may be a solid phantom. In this case, materials of the solid phantom preferably include silicon emulsion of 50%, demineralized water of 29.97%, glycerin of 15%, agar of 5%, and sodium benzoate of 0.3%.

In the preferred embodiment and the modified preferred embodiment thereof, the dimensions of the human phantom are designed as the standard dimensions of the adult male based on the predetermined statistical data. However, the present invention is not limited to this. The human phantom apparatus may be constituted based on standard dimensions of an adult female or average dimensions each separated by ages. By thus employing the human phantoms of various dimensions, it is possible to measure changes in the characteristics of the antenna due to the differences between individuals with higher accuracy.

Second Preferred Embodiment

Figure 11:
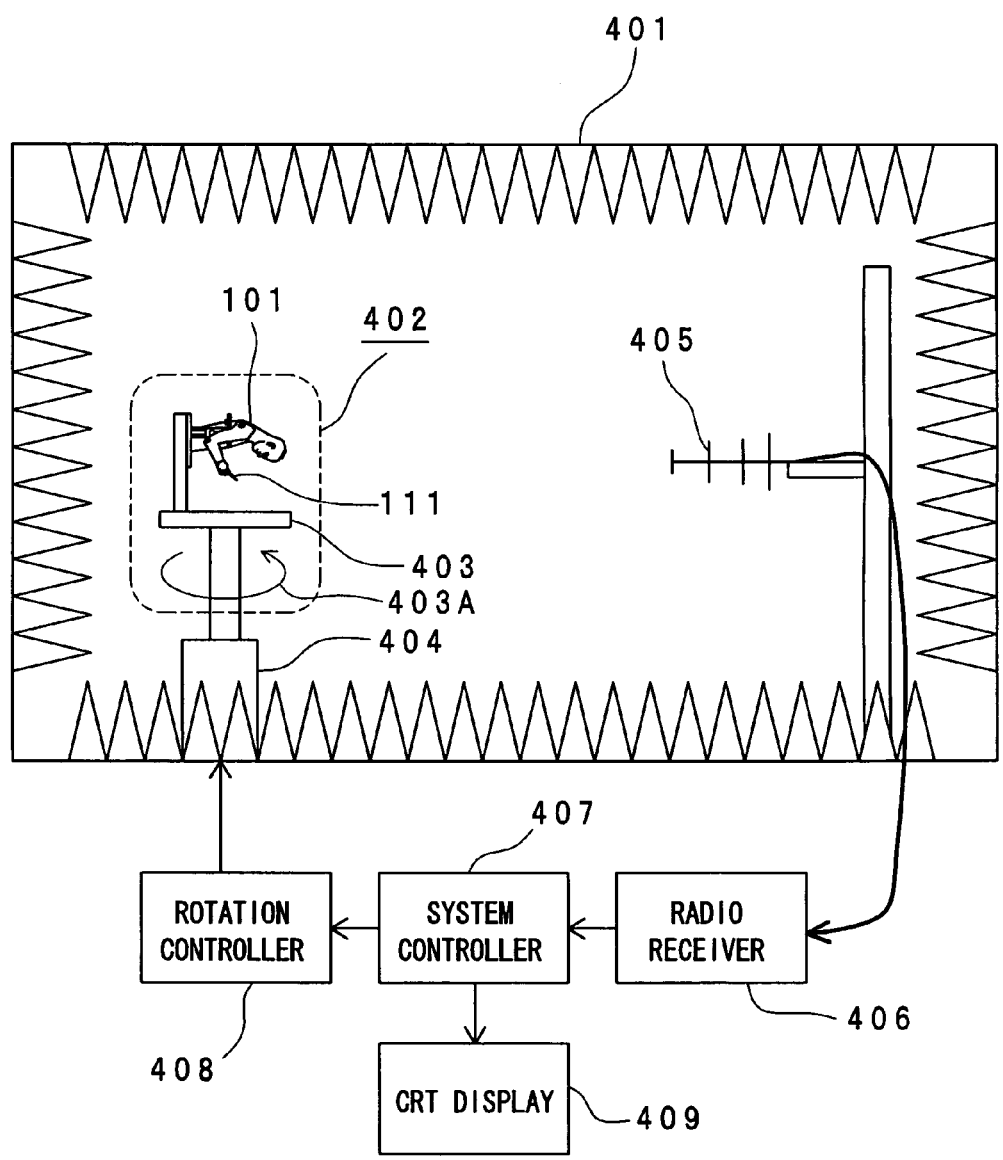
FIG. 11 is a cross-sectional view and a block diagram which illustrate a configuration of an antenna characteristic measurement system using a human phantom apparatus 101 according to a second preferred embodiment of the present invention.

FIG. 11 is a cross-sectional view and a block diagram which illustrate a configuration of an antenna characteristic measurement system using a human phantom apparatus 101 according to a second preferred embodiment of the present invention.

Referring to FIG. 11, the antenna characteristic measurement system is constituted so that a pedestal of the human phantom apparatus 101 is fixed onto a turntable 403 disposed on a floor of a radio wave darkroom 401, and so that the turntable 403 can be rotated by a motor 404. The rotation of the turntable 403 is controlled by a rotation controller 408. In addition, the human phantom apparatus 101, a portable radio communication apparatus 111, and the turntable 403 constitute a measurement target antenna 402. A receiving antenna 405 such as a Yagi-Uda antenna, a beam antenna or the like is disposed at a position where the antenna 405 is opposed to the measurement target antenna 402 in the radio wave darkroom 401.

Figure 12:
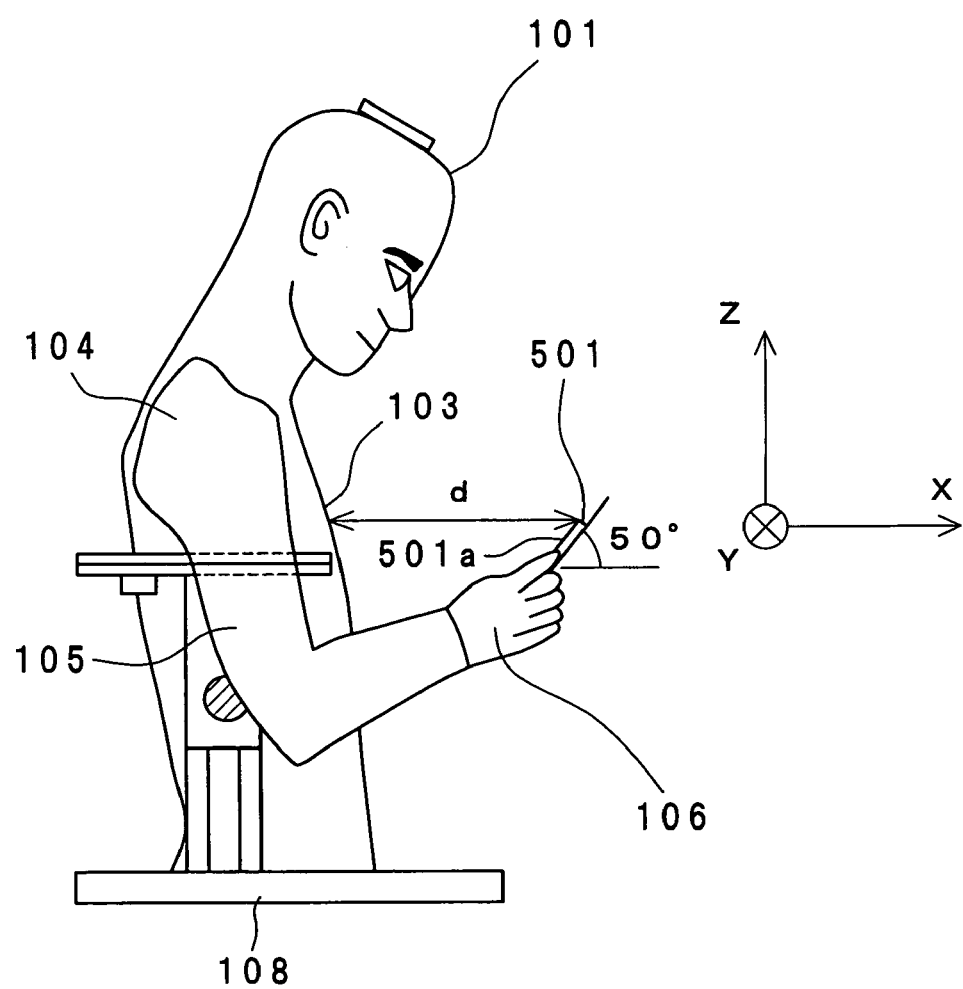
FIG. 12 is a side view which illustrates an interval "d" between a body section 103 of the human phantom apparatus 101 and a portable radio communication apparatus 501 in the human phantom apparatus 101 shown in FIG. 11.

At the time of measuring the characteristics of the antenna, the turn table 403 is rotated, a radio wave is radiated from the portable radio communication apparatus 111, the radiated radio wave is received by the reception antenna 405, then a radio signal of the received radio wave is received by a radio receiver 406, the received radio signal is subjected to processings such as high frequency amplification, frequency transformation, and detection, and thereafter, a detected electric signal is inputted to a system controller 407 including a network analyzer. The system controller 407 outputs signals such as a measurement start control signal, a measurement end control signal or the like to the rotation controller 408, measures the characteristics of the antenna, such as radiation pattern characteristics or input impedance characteristics, of the antenna 402 of the portable radio communication apparatus 111, and displays measurement results on a CRT display unit 409. In this case, as shown in FIG. 12, (a) an interval "d" between the portable radio communication apparatus 111 attached to the hand section 106 of the human phantom apparatus 101 and the body section 106 of the human phantom apparatus 101 having the PDA attitude, and (b) an inclined angle θ (which is a rotational angle from the X axis on the XZ plane of FIG. 12; this angle is referred to as an inclined angle hereinafter) of the portable radio communication apparatus 111 with respect to a depression angle direction of the human phantom apparatus 101 are adjusted to have constant values, respectively. By thus measuring the radiation pattern characteristics or impedance characteristics of the antenna included in the portable radio communication apparatus 111 using the interval "d" between the human phantom apparatus 101 and the portable radio communication apparatus 111 and the inclined angle θ as parameters, it is possible to measure influences of a human body onto the portable radio communication apparatus 111 with higher accuracy. The radiation pattern characteristics mean herein electric power antenna gain directional characteristics with respect to an arbitrary cut surface. The characteristics of the antenna according to the present invention are not limited to this, and may be antenna characteristics such as a radiation efficiency, an effective gain, a diversity antenna gain, a complex directivity gain characteristics including phase information, a correlation coefficient, or the like, which are calculated from the electric power antenna gain directional characteristics.

Figure 13:
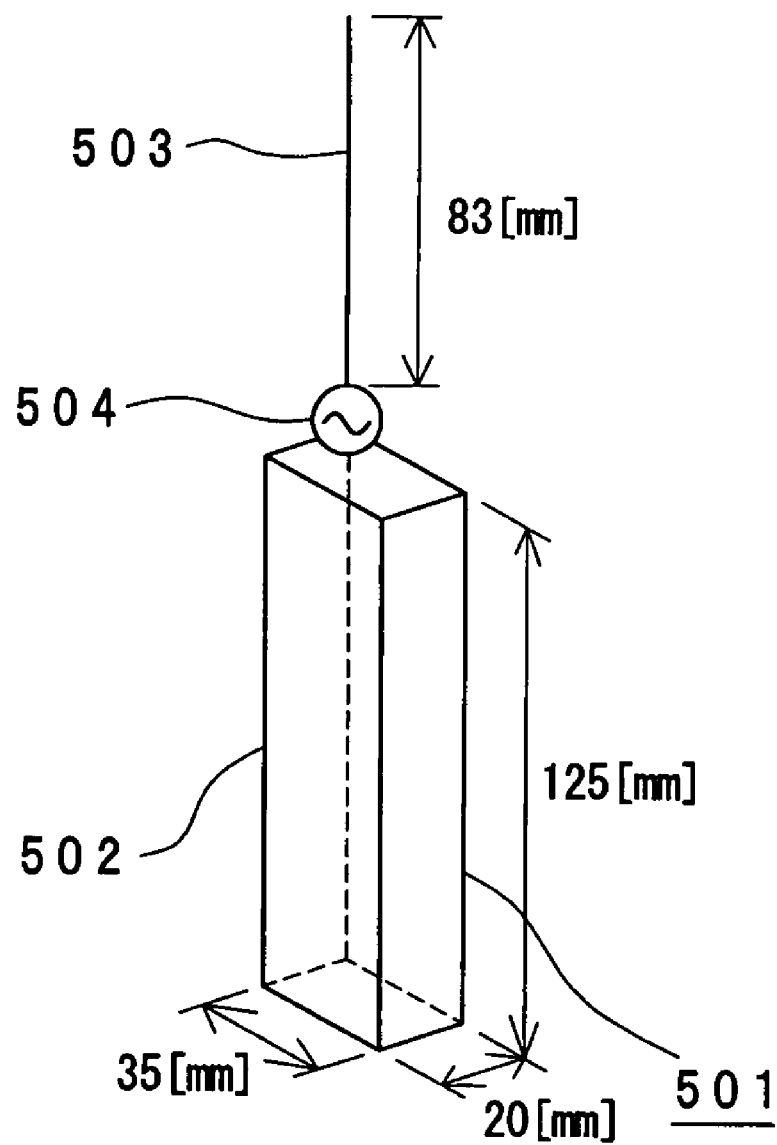
FIG. 13 is a perspective view which illustrates a shape and a size of the portable radio communication apparatus 501 used in the antenna characteristic measurement system shown in FIG. 11.
Figure 14:
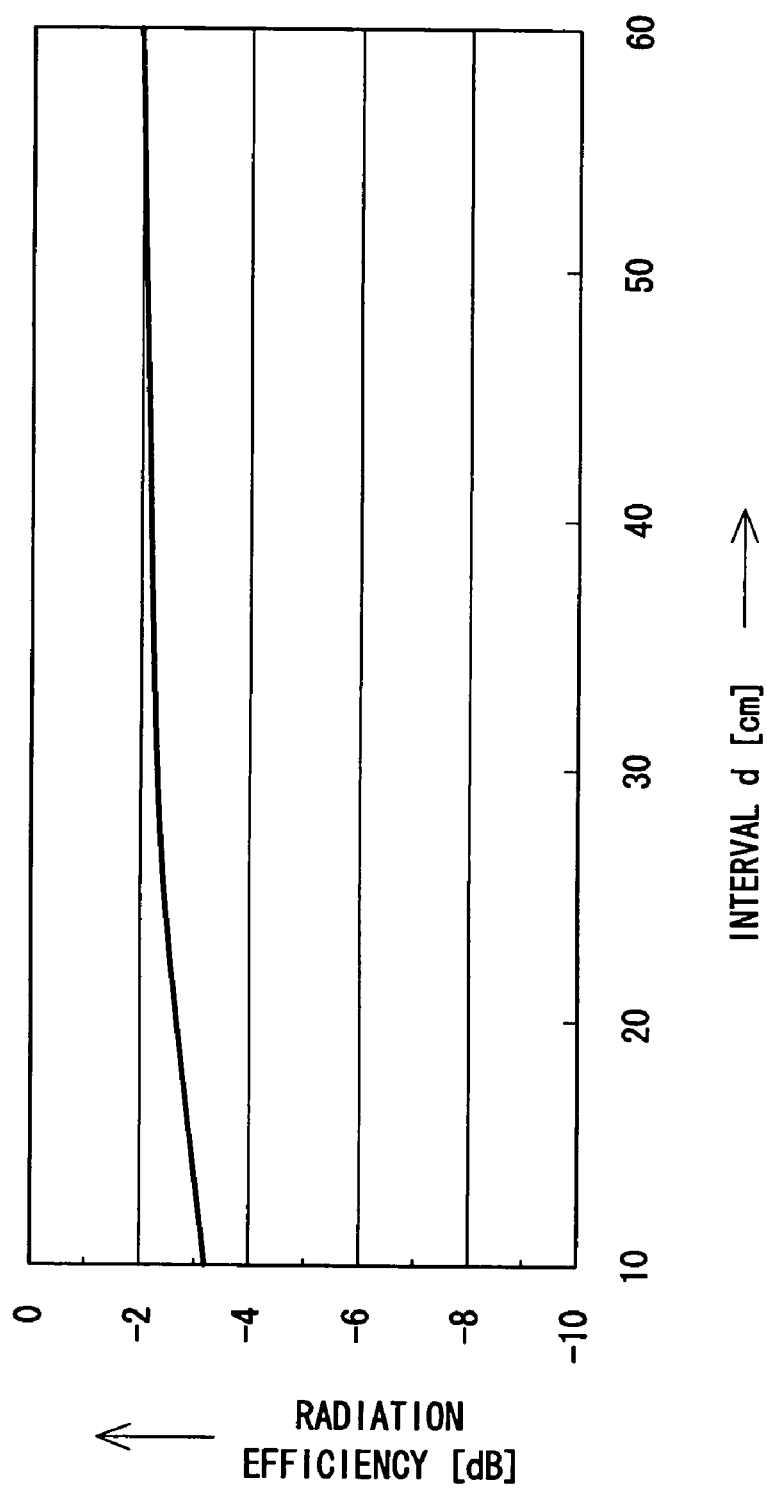
FIG. 14 is a graph which illustrates measurement results of measuring characteristics of an antenna using the antenna characteristic measurement system shown in FIG. 11, and which illustrates a radiation efficiency of an antenna of the portable radio communication apparatus 501 with respect to the interval "d"
Figure 15:
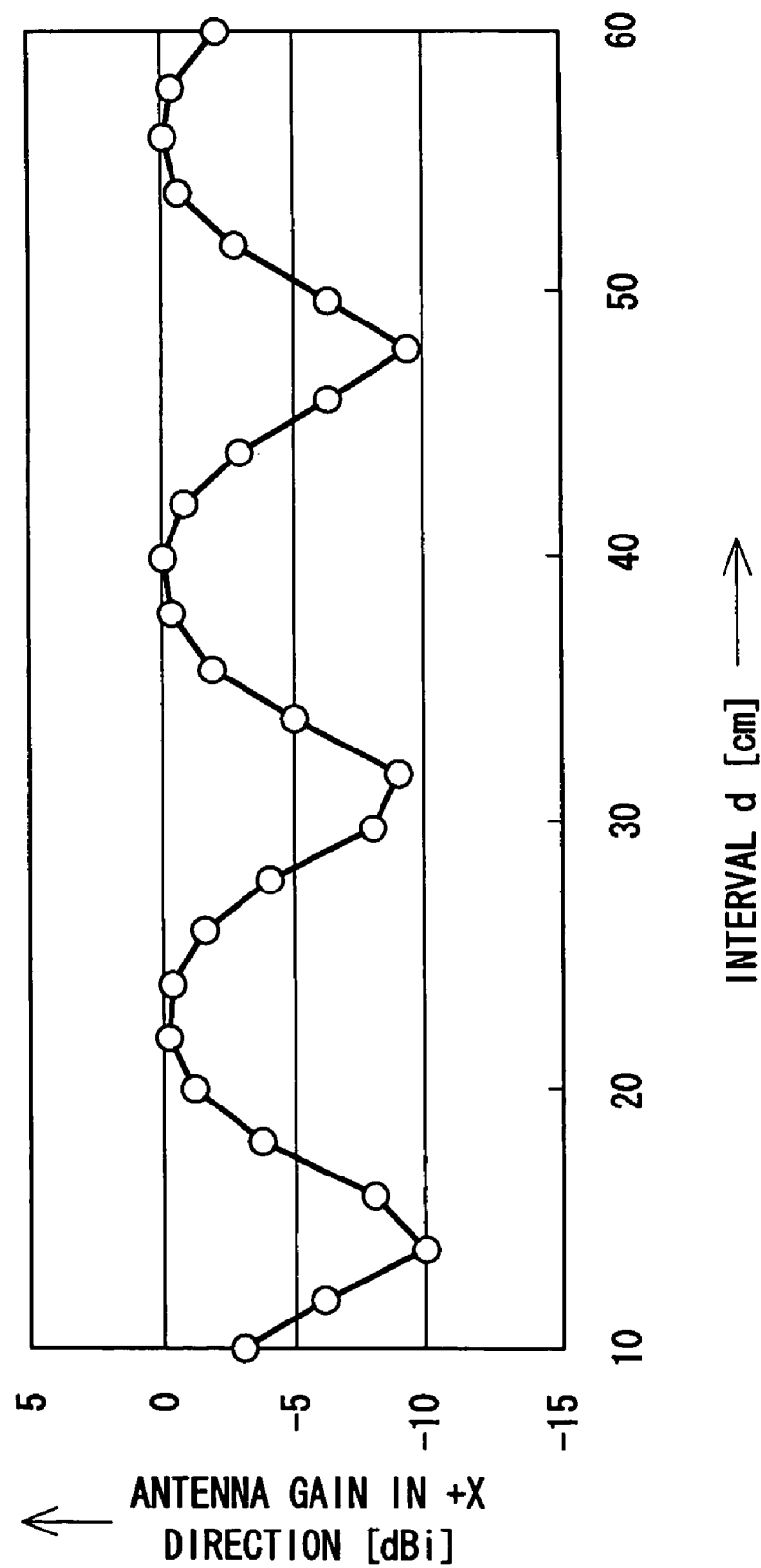
FIG. 15 is a graph which illustrates measurement results of measuring the characteristics of the antenna using the antenna characteristic measurement system shown in FIG. 11, and which illustrates antenna gain of the antenna of the portable radio communication apparatus 501 in a +X direction with respect to the interval "d"

FIG. 13 is a perspective view which illustrates a shape and a size of a portable radio communication apparatus 501 used in the antenna characteristic measurement system shown in FIG. 11. FIG. 14 is a graph which illustrates measurement results of measuring the antenna characteristics using the antenna characteristic measurement system shown in FIG. 11, and which illustrates a radiation efficiency of an antenna of the portable radio communication apparatus 501 with respect to the interval "d". FIG. 15 is a graph which illustrates measurement results of measuring the characteristics of the antenna using the antenna characteristic measurement system shown in FIG. 11, and which illustrates an antenna gain of the antenna of the portable radio communication apparatus 501 in the +X direction with respect to the interval "d".

FIG. 12 illustrates a positional relationship and a coordinate system between the human phantom apparatus 101 and the portable radio communication apparatus 501 serving as a terminal model. Referring to FIG. 13, the portable radio communication apparatus 501 serving as the terminal model is constituted to include a rectangular-parallelepiped-shaped metal housing 502 having a length of 12.5 cm, a width of 3.5 cm, and a thickness of 2 cm, and a quarter-wave monopole antenna 503 having a length of 8.3 cm. The quarter-wave monopole antenna 503 is arranged on an upper end portion of the metal housing 502 in parallel along the longitudinal direction of the metal housing 502. An electric power of radio signal is supplied to the quarter-wave monopole antenna 503 from a feeding point 504 located in a connection section located on the upper end portion of the metal housing 502. Further, referring to FIG. 12, the portable radio communication apparatus 501 serving as the terminal model is attached to and held by the hand section 106 of the human phantom apparatus 101, so that the interval between the feeding point 504 and a body section 103 of the human phantom apparatus 101 in the X direction is set to a value of "d", and so that the depression angle as rotated from the X axis to the Z axis direction is set to 50 degrees.

FIG. 14 illustrates measurement results of the radiation efficiency measured by the antenna characteristic measurement system shown in FIG. 11 if the interval "d" is changed to 13, 16, 20, 25, and 30 (cm) in such a state that the hand section 106 of the human phantom apparatus 101 holds the portable radio communication apparatus 501 serving as the terminal model. FIG. 15 illustrates measurement results of the directivity gain in the +X direction at a measurement frequency of 900 MHz.

As is apparent from FIGS. 14 and 15, the radiation efficiency of the antenna of the portable radio communication apparatus 501 is more improved as the interval "d" is larger, whereas the antenna gain in the +X direction periodically or cyclically changes relative to the change in the interval "d". In the example shown in FIG. 15, at the interval "d" of about 23, 39, and 55 cm, the maximum antenna gain of about 0 dBi is obtained. At the interval "d" of about 14, 32, and 48 cm, the minimum antenna gain of about −10 dBi is obtained. As can be seen, the large change in the antenna gain in the +X direction relative to the change in the radiation efficiency represents that the human phantom apparatus 101 functions in a manner similar to that of a reflector plate of a corner reflector antenna. In other words, if the total length of the path from a location when the radio wave having a wavelength of λ is radiated from the antenna through a location when it is reflected by the human phantom apparatus 101 to a location when it is returned to the antenna is λ/2, then the radiated radio wave and the incident radio wave after being reflected are opposite in phase at the position of the antenna to be cancelled by each other. If the total length of the path is λ, the radio waves are equal in phase, so that these radio waves are summed up. These relations can be expressed by, for example, the following Equations (1) and (2):

$$d = \lambda/4 + (n\lambda)/2 \quad (1), \text{ and}$$

$$d = (n\lambda)/2 \quad (2).$$

In the Equations (1) and (2), "n" denotes an integer equal to or larger than zero. The Equation (1) represents such a case where the directivity gain in the +X direction is the minimum. The Equation (2) represents such a case where the directivity gain in the +X direction is the maximum. Actually, however, since the shape of the human body has irregularities, an absolute value of the interval "d" is not strict. Therefore, it is rather important to periodically or cyclically repeat high and low gains at an interval of $\lambda/2$. This is evident from FIG. 15. With the used frequency f of, for example, 900 MHz, $\lambda/2$ is 16.7, which is an intensifying condition based on the Equation (2). In FIG. 15, at the interval "d" of 20 cm, the antenna gain in the +X direction is the maximum; however, at the interval "d" of 13.30 cm, the antenna gain in the +X direction is the minimum. It is understood from FIG. 15 that a change amount of the interval "d" at this time is 17 cm corresponding to $\lambda/2$.

Figure 18:
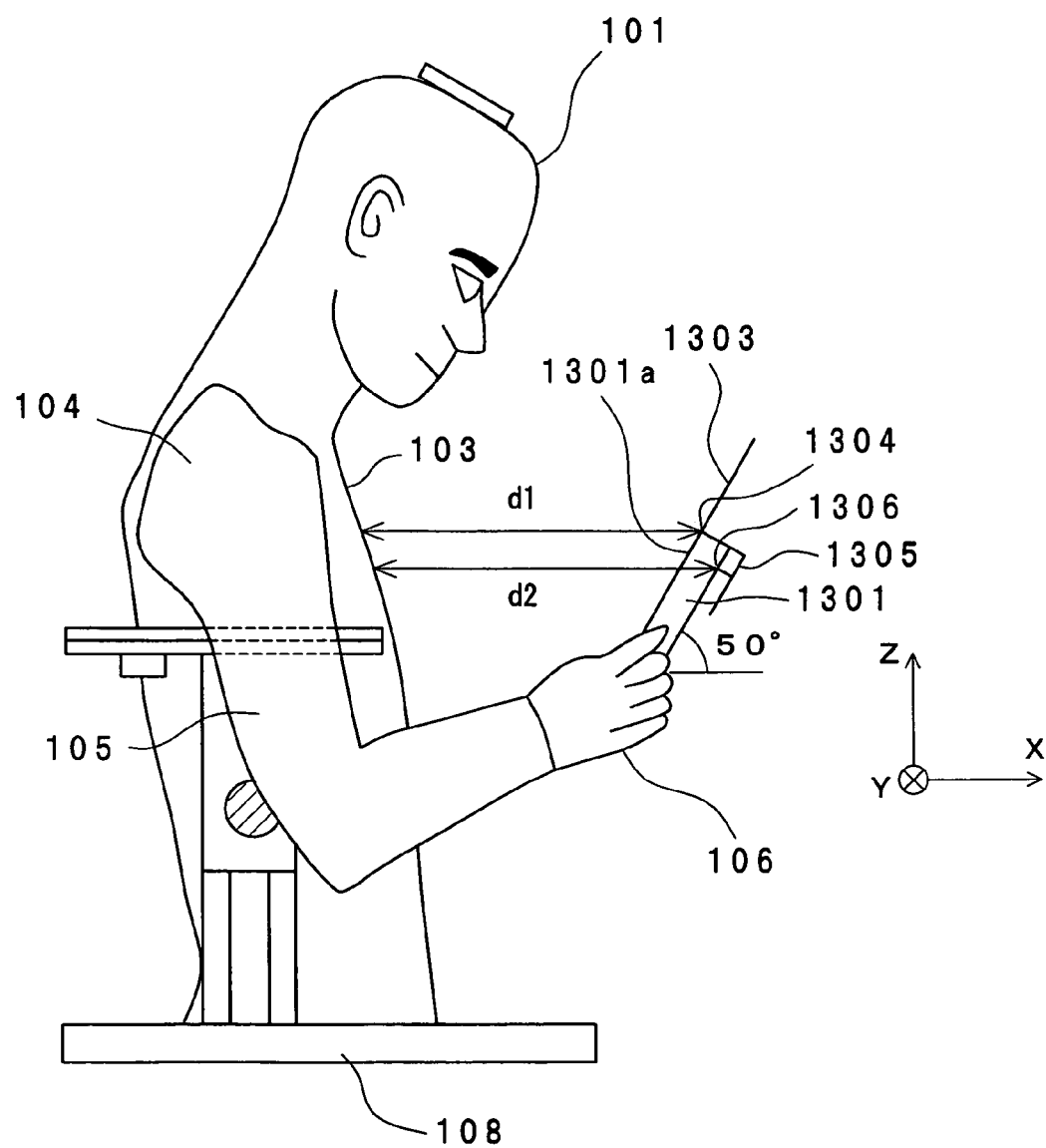
FIG. 18 is a side view which illustrates intervals "d1" and "d2" between the feeding points 1304 and 1306 of the respective two antennas 1303 and 1305 and the body section 103 in such a state that the portable radio communication apparatus 1301 shown in FIG. 16 is inclined at 50 degrees when the portable radio communication apparatus 1301 is held by the human phantom apparatus 101.

As can be seen from the above, as shown in FIG. 18, when a plurality of antennas 1303 and 1305 is arranged on the portable radio communication apparatus 111, the respective antennas 1303 and 1305 are arranged at positions of the maximum antenna gain and the minimum antenna gain so that the antenna at one position has the minimum antenna gain, and the antenna at the other position always has the maximum antenna gain, respectively, namely, so that the absolute value d0=|d1−d2| of the difference between intervals "d1" and "d2" between the respective antennas 1303 and 1305 and the body section 103 of the human phantom apparatus 101 (the difference between the intervals d1 and d2 in the horizontal direction, in such a state that the portable radio communication apparatus 111 is held and inclined at the inclined angle of, for example, 50 degrees in FIG. 18) is $\lambda/4, 3\lambda/4, 5\lambda/4, 7\lambda/4, \ldots$, that is, so that the absolute value d0 of the difference between the intervals "d1" and "d2" satisfies the following Equation (3). In this case, it is possible to improve the diversity effect with respect to the +X axis direction and to thereby greatly improve practical reception sensitivity and transmission radiation characteristics of the radio communication apparatus 111:

$$d0 = \lambda/4 + (n\lambda)/2 \quad (3).$$

In the Equation (3), "n" denotes an integer equal to or larger than zero. Referring to FIG. 18, the positions of the body section 103 when the intervals "d1" and "d2" are measured actually are different from each other, respectively, between the intervals "d1" and "d2", namely, they are slightly different from each other in the horizontal direction. However, when designing the antenna position of the portable radio communication apparatus 111, the positional difference may be set to substantially zero, and the Equation (3) may be applied. However, if the positions of the two antennas in the vertical direction in the portable radio communication apparatus 111 are greatly different from each other, it is necessary to apply the Equation (3) in light of the actual intervals "d1" and "d2" in the horizontal direction due to the difference in the positions of the body section. It is to be noted that, when designing the portable radio communication apparatus 111, the size of an actual user, a standard size, or a specific size instead of the body section 103 of the human phantom apparatus 101 may be considered.

Furthermore, if the portable radio communication apparatus and a base station are located within a line of sight, for example, at hot spots such as those at a railway station, a park or the like in a propagation environment within a line of sight, it can be easily supposed that a time occupation rate of the antenna having a high reception level when diversity reception is carried out. Therefore, by using the antenna having a higher reception level as a transmission antenna, the telephone speech quality of the potable radio communication apparatus can be further improved. In this case, it is more effective when the absolute value of the difference between the intervals "d1" and "d2" between the respective antennas and the human body is $\lambda/4$. In case of an application in the 2 GHz band, for example, $\lambda/4$ corresponds to an interval of 3.75 cm. Therefore, when the two antennas are arranged at an interval of 3.75 cm, and the antenna having a higher reception level is used as the transmission antenna, then it is possible to suppress deterioration of the antenna sensitivity that depends on the PDA attitude of the portable radio communication apparatus as compared with the arrangement of the antennas at an interval of 7.5 cm. The same thing is true for an application in a 5 GHz band. Then $\lambda/4$ corresponds to an interval of 1.5 cm, and therefore, when the two antennas are arranged at an interval of 1.5 cm or 4.5 cm and the antenna having a higher reception level is used as the transmission antenna, then it is possible to suppress the deterioration of the antenna sensitivity that depends on the PDA attitude of the portable radio communication apparatus, as compared with the arrangement of the antennas at an interval of 3 cm or 6 cm which is a multiple of a natural number of $\lambda/2$. In case of an application in an 8 GHz band, $\lambda/4$ corresponds to an interval of 1 cm or less. Therefore, utilizing the periodic or cyclic change in the antenna gain, the antennas may be arranged at an interval of, for example, $3\lambda/4$ or $5\lambda/4$. In this case, the same advantageous effects can be attained.

Figure 16:
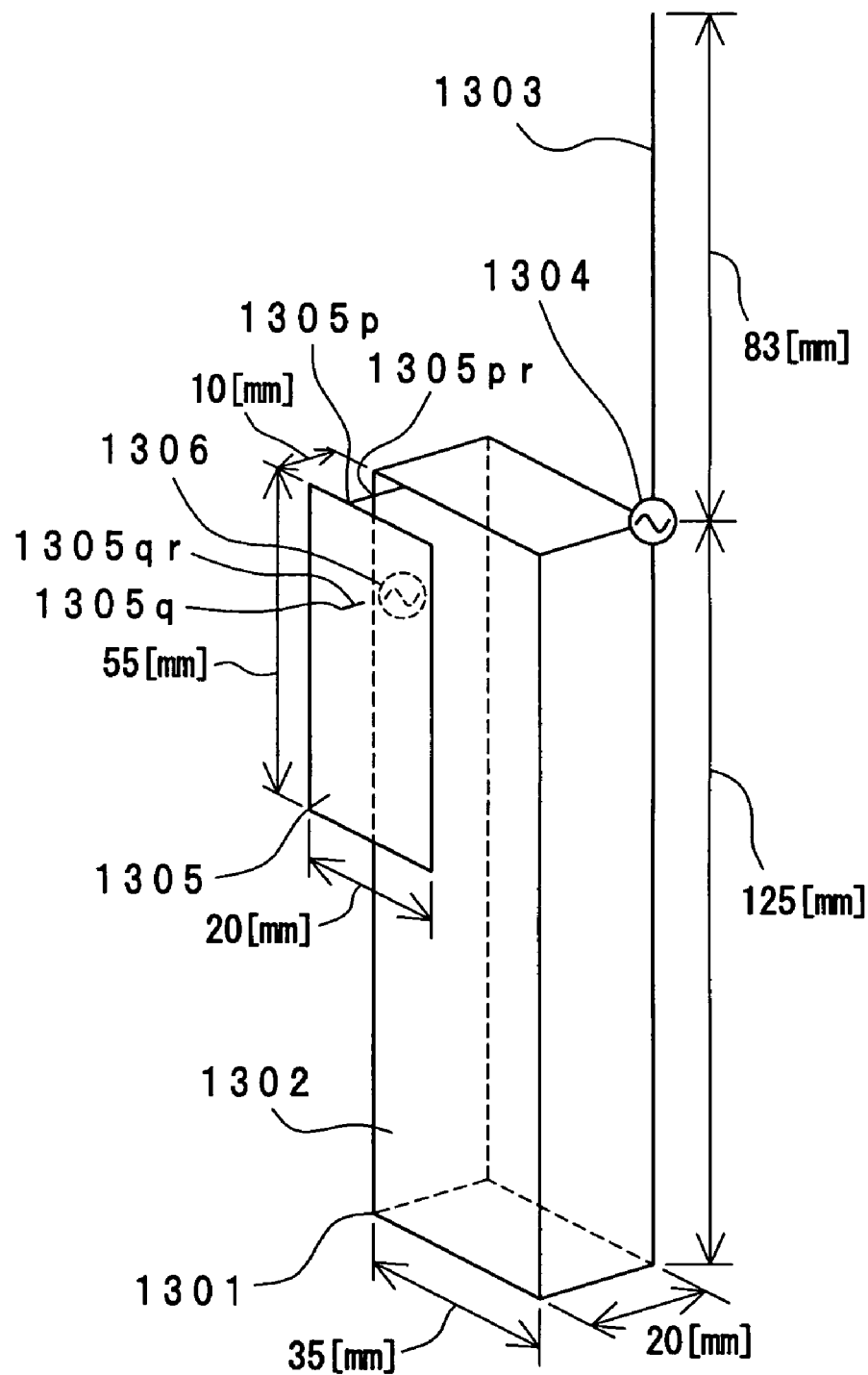
FIG. 16 is a perspective view which illustrates a shape and a size of a portable radio communication apparatus 1301 that includes two antennas 1303 and 1305 according to a first implemental example of the present invention.

FIG. 16 is a perspective view which illustrates a shape and a size of a portable radio communication apparatus 1301 that includes two antennas 1303 and 1305 according to a first implemental example of the present invention.

Referring to FIG. 16, a monopole antenna 1303 having a feeding point 1304 in a corner of an upper end surface of a metal housing 1302 of the portable radio communication apparatus 1301 is provided so as to extend in the vertical direction. On the other hand, a planar inverted-F antenna 1305 is provided on an upper left portion of a front surface of the metal housing 1302 so as to be in parallel to the front surface thereof. A position 1305$q$ located on the surface of the planar inverted-F antenna 1305 to be slightly shifted from the central portion of the surface is connected with a feeding point 1306 on the front surface through a feeding conductor 1305$qr$, and a position 1305$p$ of a part of an edge of an upper end portion of the planar inverted-F antenna 1305 is short-circuited so as to be grounded to the metal housing through a short-circuit conductor 1305$pr$. The two antennas 1303 and 1305 are connected with a radio communication circuit (not shown) through the feeding points 1304 and 1306, respectively. The radio communication circuit includes a radio receiver, a radio transmitter, a diversity control circuit for carrying out diversity reception and diversity transmission using the two antennas 1303 and 1305, and a controller that controls the respective components of the circuit.

Figure 17:
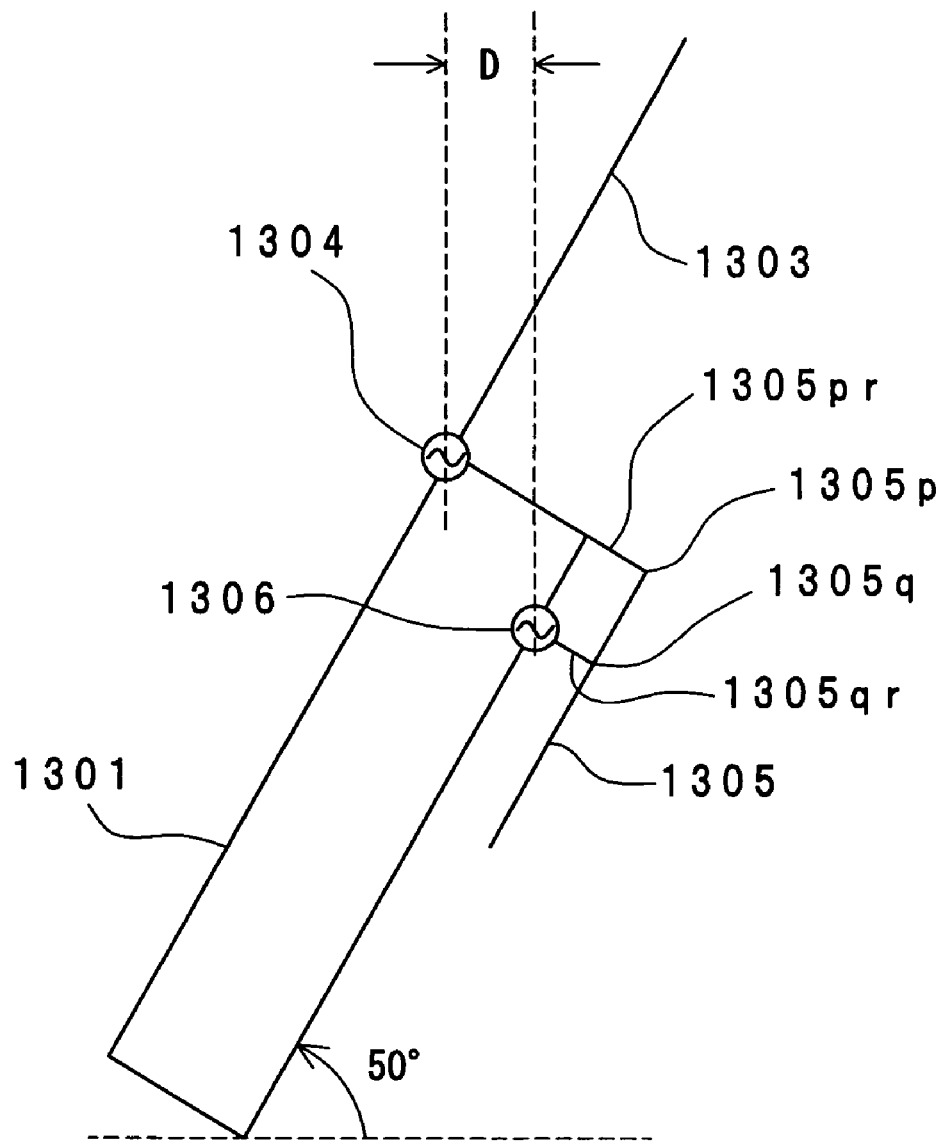
FIG. 17 is a side view which illustrates a horizontal interval "D" between feeding points 1304 and 1306 of the two antennas 1303 and 1305, respectively, in such a state that the portable radio communication apparatus 1301 shown in FIG. 16 is inclined at 50 degrees when the portable radio communication apparatus 1301 is held by the human phantom apparatus 101.

FIG. 17 is a side view which illustrates a horizontal interval "D" between the feeding points 1304 and 1306 of the two antennas 1303 and 1305, respectively, in such a state that the portable radio communication apparatus 1301 shown in FIG. 16 is held so as to be inclined at an inclined angle of 50 degrees when the potable radio communication apparatus 1301 is held by the human phantom apparatus 101. FIG. 17 illustrates the horizontal interval "D" between the feeding points 1304 and 1306 of the respective antennas 1303 and 1305 in such a state that the portable radio communication apparatus 1301 is held so as to be inclined at the inclined angle of 50 degrees and held. The respective antennas 1303 and 1305 are located at the positions of the maximum antenna gain and the position of the minimum antenna gain, respectively, (namely, the antenna at one position has minimum antenna gain, the antenna at the other position always has maximum antenna gain), so that the above-defined interval "D" becomes $\lambda/4, 3\lambda/4, 5\lambda/4, 7\lambda/4, \ldots$, as mentioned above when the positions of the body section 103 in the horizontal direction which are reference points of the intervals "d1" and "d2" substantially coincide with each other in FIG. 18, namely, becomes the right side of the Equation (3), or, so that the absolute value d0=D of the difference between the intervals "d1" and "d2" shown in FIG. 18 satisfies the Equation (3). In this case, it is possible to improve the diversity effect with respect to the +X axis direction.

It is noted that the inclined angle θ in the horizontal direction is not limited to 50 degrees but may be any inclined angle at which the user holds the portable radio communication apparatus 111 when inclining the portable radio communication apparatus 111. The horizontal inclined angle is set preferably to an angle in a range from 20 to 70 degrees, more preferably to an angle in a range from 30 to 60 degrees. Further, the present invention is not limited to this, and the absolute value d0 of the difference between the intervals may be set when the portable radio communication apparatus 111 is not inclined, namely, at the inclined angle θ of 90 degrees.

Figure 19:
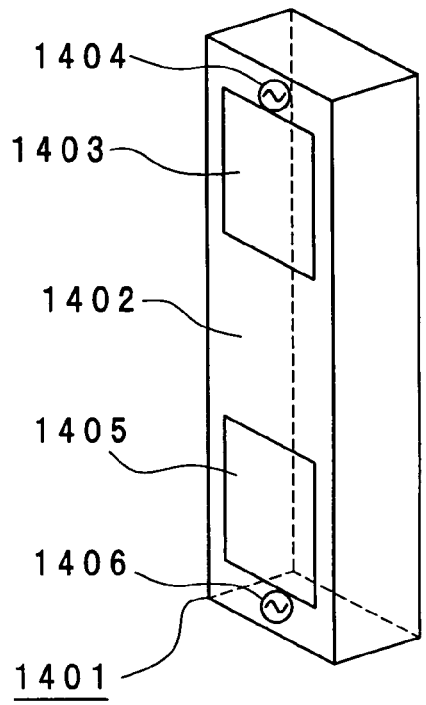
FIG. 19 is a perspective view which illustrates a shape and a size of a portable radio communication apparatus 1401 that includes two antennas 1403 and 1405 according to a second implemental example of the present invention.

FIG. 19 is a perspective view which illustrates a shape and a size of a portable radio communication apparatus 1401 that includes two antennas 1403 and 1405 according to a second implemental example of the present invention.

Referring to FIG. 19, the housing antennas 1403 and 1045 each made of a rectangular conductor pattern are formed in the vicinity of an upper end portion and that of a lower end portion of a rear surface (on a front surface opposed to which, a liquid crystal display unit and a keypad are formed) of a resin housing 1402 of the portable radio communication apparatus 1401, respectively. A feeding point 1404 of the housing antenna 1403 is located so as to be closer to the upper end portion, whereas a feeding point 1406 of the housing antenna 1405 is located so as to be closer to the lower end portion.

Figure 20:
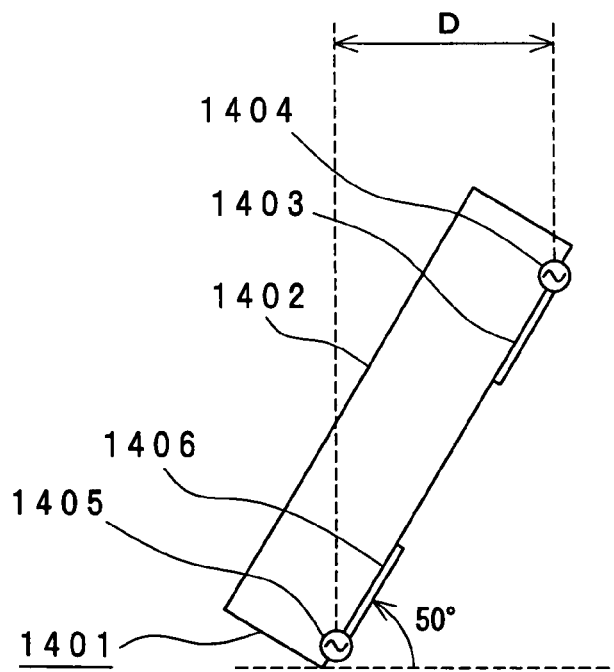
FIG. 20 is a side view which illustrates a horizontal interval "D" between feeding points 1404 and 1406 of two antennas 1403 and 1405, respectively, in such a state that the portable radio communication apparatus 1401 shown in FIG. 19 is inclined at 50 degrees when the portable radio communication apparatus 1401 is held by the human phantom apparatus 101.

FIG. 20 is a side view which illustrates a horizontal interval "D" between the feeding points 1404 and 1406 of the two antennas 1403 and 1405, respectively, in such a state that the portable radio communication apparatus 1401 shown in FIG. 19 is inclined at an inclined angle of 50 degrees when the portable radio communication apparatus 1401 is held by the human phantom apparatus 101. FIG. 20 illustrates the horizontal interval "D" between the feeding points 1404 and 1406 of the respective antennas 1403 and 1405 when the portable radio communication apparatus 1403 is inclined at the inclined angle of 50 degrees and held. The respective antennas 1403 and 1405 are located at the positions of the maximum antenna gain and the position of the minimum antenna gain, respectively, (namely, the antenna at one position has minimum antenna gain, the antenna at the other position always has maximum antenna gain), so that the above-defined interval "D" becomes $\lambda/4, 3\lambda/4, 5\lambda/4, 7\lambda/4, \ldots$, as mentioned above when the positions of the body section 103 in the horizontal direction which are reference points of the intervals "d1" and "d2" substantially coincide with each other in FIG. 18, namely, becomes the right side of the Equation (3), or, so that the absolute value d0=D of the difference between the intervals "d1" and "d2" shown in FIG. 18 satisfies the Equation (3). In this case, it is possible to improve the diversity effect with respect to the +X axis direction.

In the second preferred embodiment as mentioned above, when changing the interval "d" and the inclined angle θ, the characteristics of the antenna of the portable radio communication apparatus 111 are measured. However, the present invention is not limited to this. The characteristics of the antenna of the portable radio communication apparatus 111 may be measured by changing a vertical height of the portable radio communication apparatus 111 using the shoulder sliding mechanism that includes the sliding sections 103a and 104b. That is, in the measurement of the characteristics of the antenna of the portable radio communication apparatus 111, the characteristics of the antenna may be changed by changing at least one parameter selected from the interval "d", the inclined angle θ, and the height.

Third Preferred Embodiment

Figure 21:
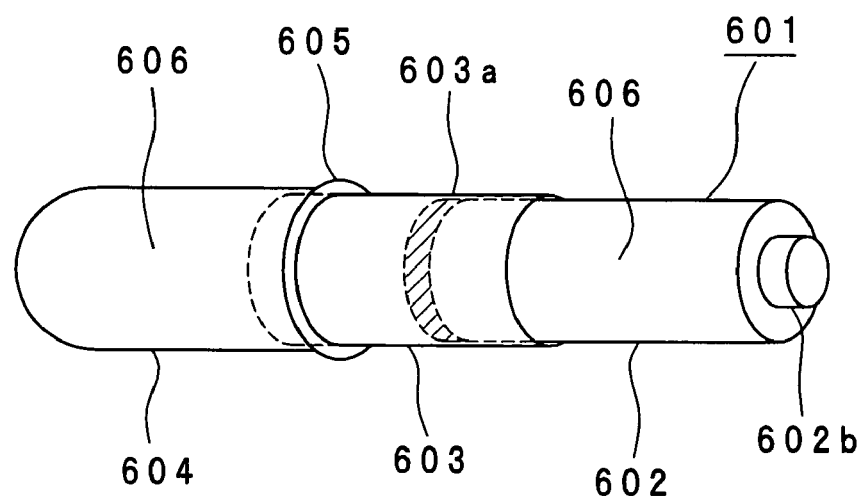
FIG. 21 is a perspective view which illustrates an appearance of a finger phantom apparatus 601 according to a third preferred embodiment of the present invention when a physiological saline solution is injected into the finger phantom apparatus 601.
Figure 22:
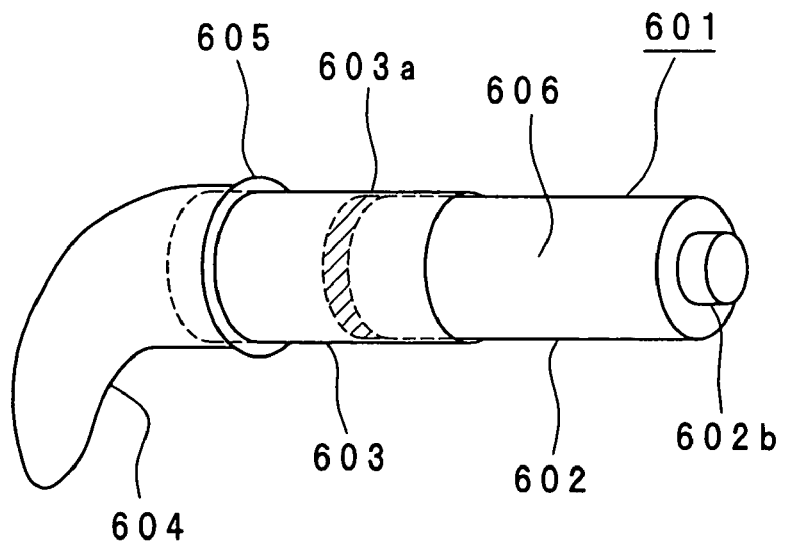
FIG. 22 is a perspective view which illustrates an appearance of the finger phantom apparatus 601 shown in FIG. 21 when the physiological saline solution is not injected into the finger phantom apparatus 601.
Figures 23A, 23B:
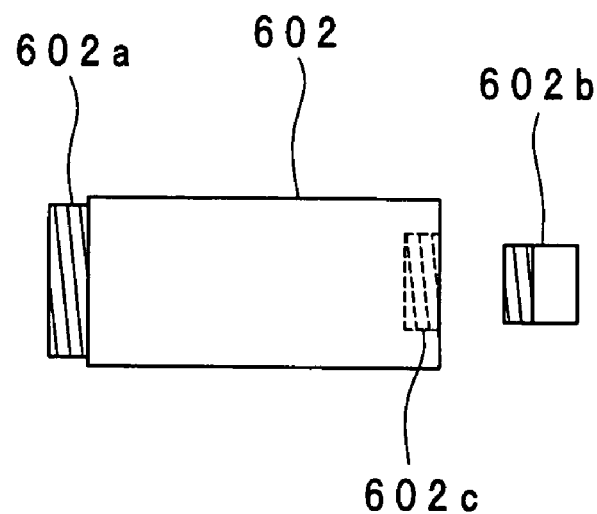
FIG. 23A is a side view which illustrates a configuration of a finger phantom root section 602 of the finger phantom apparatus 601 shown in FIG. 21.
FIG. 23B is a side view which illustrates a configuration of a screw section 602b engaged with the finger phantom root section 602 shown in FIG. 23A.
Figure 24:
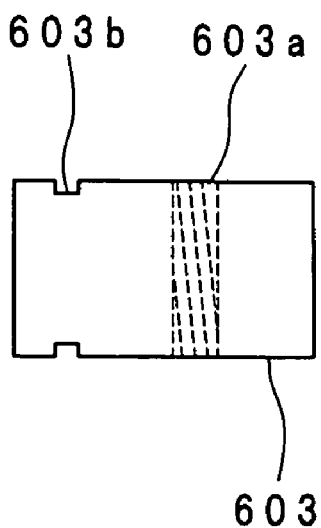
FIG. 24 is a side view which illustrates a configuration of a circular cylindrical member 603 with which the finger phantom root section 602 shown in FIG. 23A is engaged.

FIG. 21 is a perspective view which illustrates an appearance of a finger phantom apparatus 601 according to the third preferred embodiment of the present invention when a physiological saline solution 606 is injected into the finger phantom apparatus 601. FIG. 22 is a perspective view which illustrates an appearance of the finger phantom apparatus 601 shown in FIG. 21 when the physiological saline solution 606 is not injected into the finger phantom apparatus 601. FIG. 23A is a side view which illustrates a configuration of a finger phantom root section 602 of the finger phantom apparatus 601 shown in FIG. 21. FIG. 23B is a side view which illustrates a configuration of a screw section 602b engaged with the finger phantom root section 602 shown in FIG. 23A. FIG. 24 is a side view which illustrates a configuration of a circular cylindrical member 603 with which the finger phantom root section 602 shown in FIG. 23A is engaged.

As shown in FIGS. 21, 22, 23A and 23B, the finger phantom apparatus 601 of the present preferred embodiment is characterized by including the hollow finger phantom root section 602, the hollow circular cylindrical member 603, and a fingertip section 604 including a hollow container made of an elastic material such as rubber or the like.

Referring to FIGS. 23A and 23B, the screw section 602a is formed on a left tip end of the finger phantom root section 602, and a screw reception section 602c is formed on a right tip end of the section 602. A physiological saline solution or an SAR solution, for example, is injected so as to be filled into the finger phantom root section 602 as a human body equivalent material. By screwing the screw section 602 with the screw reception section 602c, a right end portion of the finger phantom root section 602 is sealed.

Referring to FIG. 24, the circular cylindrical member 603 is a hollow circular cylindrical member made of resin such as acryl, polypropylene or the like. A screw reception section 603a is formed in the circular cylindrical member 603. A ring-shaped groove having a diameter smaller than an outer diameter of the circular cylindrical member 603 is formed in a fingertip fixing section 603b provided in the vicinity of one end portion or a left end portion of the circular cylindrical member 603. As shown in FIGS. 21 and 22, by fitting a ring-shaped stopper 605 into this groove on the circular cylindrical member 603 through the fingertip section 604, the fingertip section 604 is fixed onto the circular cylindrical member 603 by the stopper 605.

In the finger phantom apparatus 601 shown in FIG. 22, the finger phantom root section 602 is inserted into the circular cylindrical member 603 to screw the screw section 602a of the circular cylindrical member 603 with the screw reception section 603a of the finger phantom root section 602. In addition, the screw section 602b is inserted into the screw reception section 602c of the finger phantom root section 602 to screw the screw section 602b with the screw reception section 602c, and the fingertip section 604 is faded away. Next, the screw section 602b is unscrewed, the physiological saline solution 606 or the SAR solution is filled into the fingertip section 604, the circular cylindrical member 603, and the finger phantom root section 602, thereafter, the screw section 602b is screwed, and this leads to that the fingertip section 604 is fully filled so as to be sealed as shown in FIG. 21.

Figure 25:
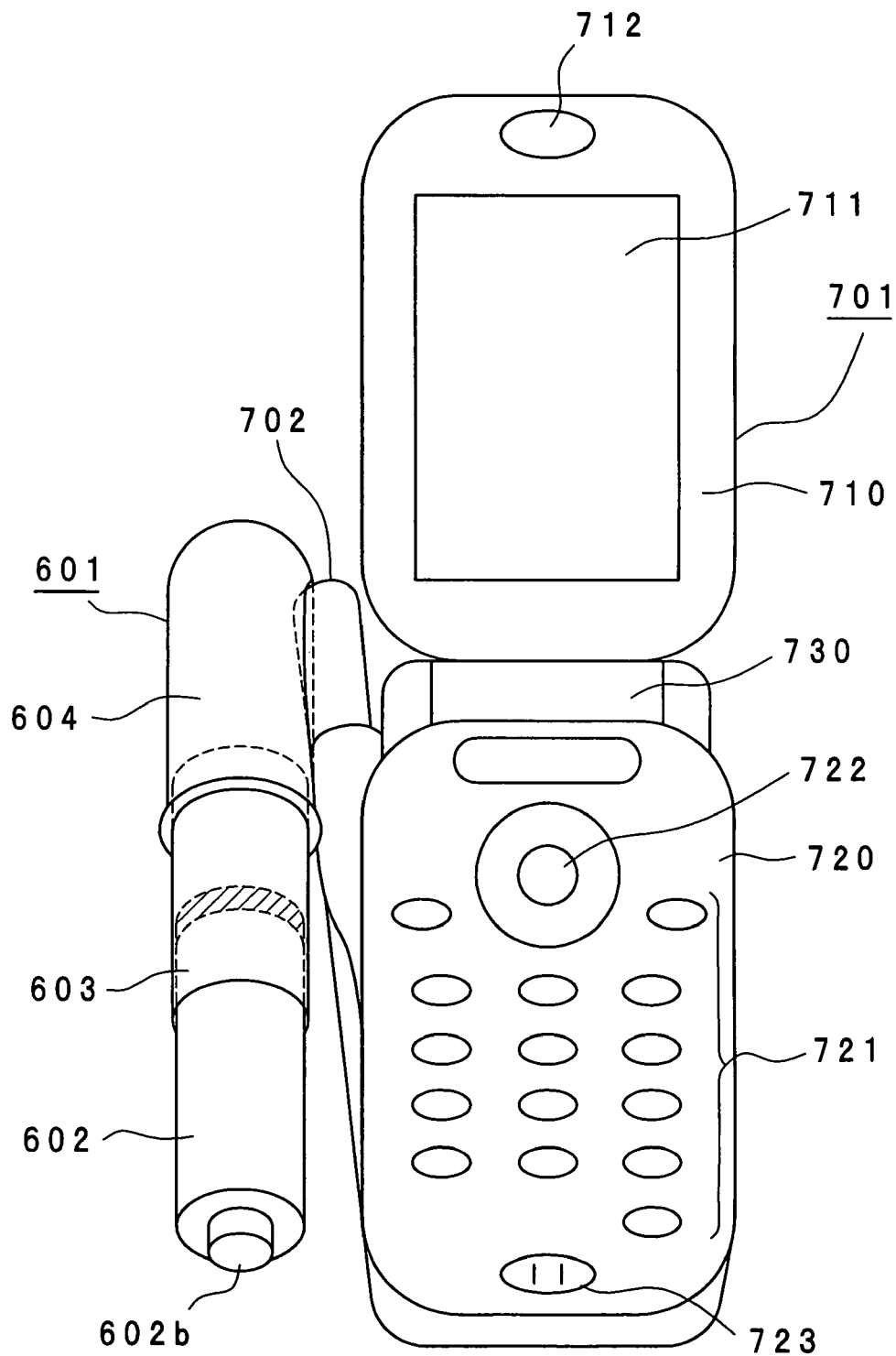
FIG. 25 is a front view which illustrates such a state that the finger phantom apparatus 601 shown in FIG. 21 is brought into contact with an antenna 702 of a folding portable radio communication apparatus 702.
Figure 26:
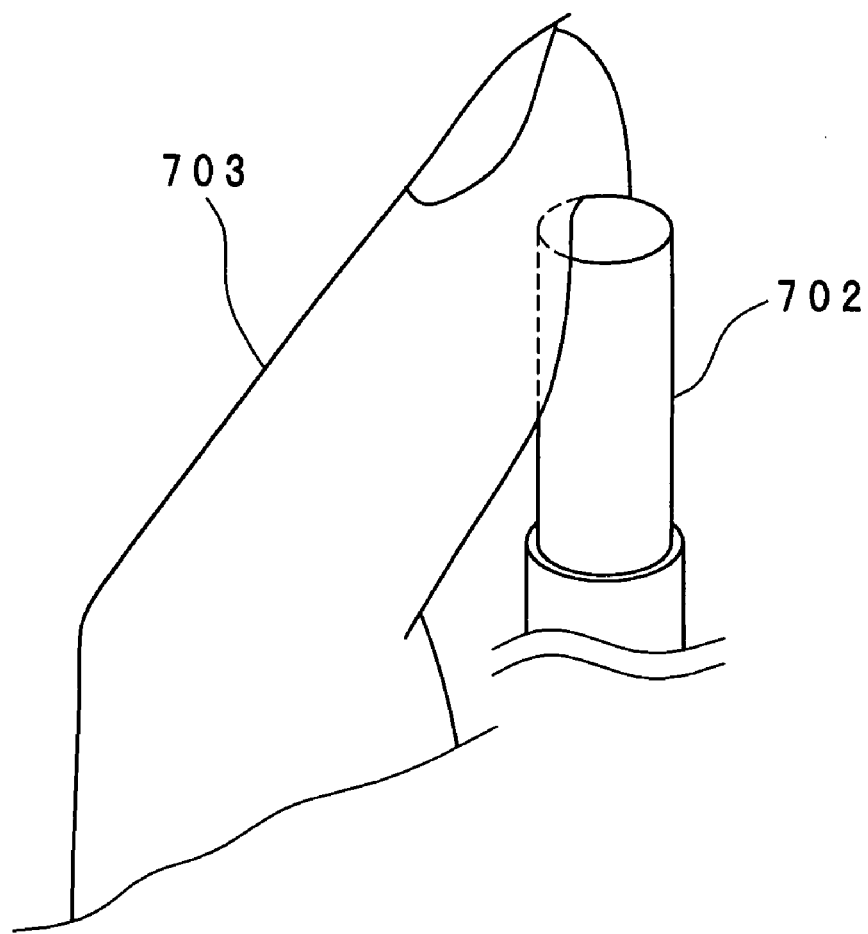
FIG. 26 is a perspective view which illustrates such a state that a real thumb 703 contacts with the antenna 702 shown in FIG. 25.

FIG. 25 is a front view which illustrates such a state that the finger phantom apparatus 601 shown in FIG. 21 is brought into contact with an antenna 702 of a folding portable radio communication apparatus 702. FIG. 26 is a perspective view which illustrates such a state that a real thumb 703 contacts with the antenna 702 shown in FIG. 25. In case of the conventional solid phantom or liquid phantom using a hard container made of FRP resin or the like, the contact portion of the phantom with the antenna 702 is limited to only a part of the antenna 702. Due to this, it is extremely difficult to faithfully simulate such a state that the actual thumb contacts with the antenna 702 as shown in FIG. 26.

In contrast, there will be considered an instance in which the finger phantom apparatus 601 including the fingertip section 604 made of the elastic material such as rubber or the like is brought into contact with the antenna 702 of the portable radio communication apparatus 701 as shown in FIG. 25. The portable radio communication apparatus 701 is constituted so that an upper housing 710 and a lower housing 720 are foldable through a hinge section 730. A liquid crystal display unit 711 is arranged in a central portion of an inner side surface of the upper housing 710, and a sound hole section 712 for outputting a voice produced from a loudspeaker is formed above the liquid crystal display unit 711. In addition, a keypad section 721 including a key 222 and serving as input means is arranged in a central portion of the lower housing 720, and a microphone 723 is arranged below the keypad section 721. Further, the antenna 702 is arranged to extend upward so as to protrude from an upper left end portion of the lower housing.

Referring to FIG. 25, when the fingertip section 604 is brought into contact with the antenna 702 using the finger phantom apparatus 601 including the fingertip section 604 made of the elastic material such as rubber or the like, a part of the fingertip section 604 in contact with the antenna 702 is depressed in accordance with a contact pressure. Therefore, it is possible to simulate almost the same state as or similar state to that of the actual finger, and to measure the characteristics of the antenna 702 with accuracy higher than that of the prior art. In addition, the thickness of the container of the fingertip section 604 can be reduced as compared with that of the conventional liquid phantom. Therefore, it is possible to be closer to an actual contact state, and to measure the characteristics of the antenna 702 with accuracy higher than that of the prior art.

Modified Preferred Embodiment of Third Preferred Embodiment

Figure 27:
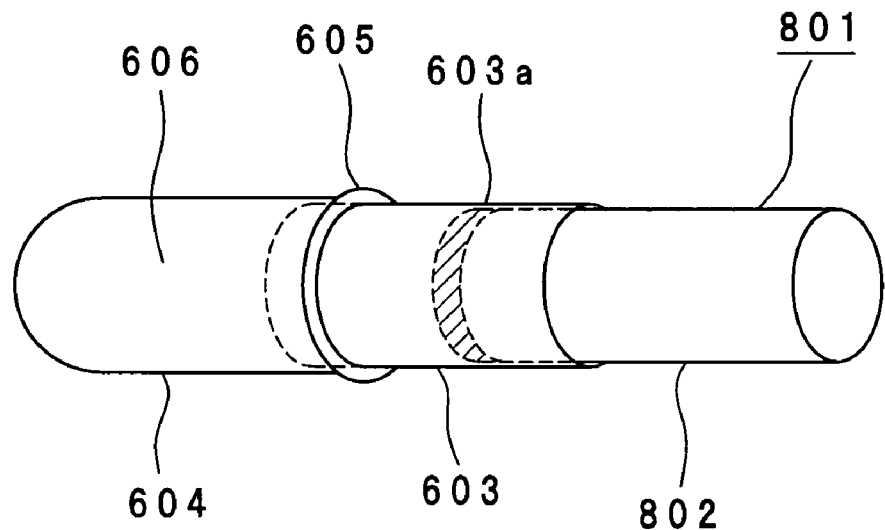
FIG. 27 is a perspective view which illustrates an appearance of a finger phantom apparatus 801 according to a modified preferred embodiment of the third preferred embodiment of the present invention.
Figure 28:
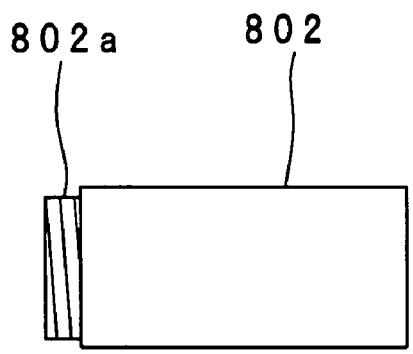
FIG. 28 is a side view which illustrates an appearance of a finger phantom root section 802 shown in FIG. 27.

FIG. 27 is a perspective view which illustrates an appearance of a finger phantom apparatus 801 according to a modified preferred embodiment of a third preferred embodiment of the present invention. FIG. 28 is a side view which illustrates an appearance of a finger phantom root section 802 shown in FIG. 27.

Referring to FIGS. 27 and 28, the finger phantom apparatus 801 according to the modified preferred embodiment of the third preferred embodiment is characterized by including the finger phantom root section 802 made of a solid phantom material such as composite dielectric or the like, instead of the finger phantom root section 602 shown in FIG. 21. A screw section 802a is provided on a left end portion of the finger phantom root section 802. The screw section 802a is inserted into and screwed with a screw reception section 603a of a circular cylindrical member 603. The solid phantom material preferably includes silicon emulsion of 50%, demineralized water of 29.97%, glycerin of 15%, agar of 5%, and sodium benzoate of 0.3%. Even in the finger phantom apparatus 801 constituted as mentioned above, a fingertip section 604 that is a section in contact with an antenna or a portable radio communication apparatus is the liquid phantom having a physiological saline solution 606 filled into a container made of an elastic member such as rubber. The finger phantom apparatus 801 according to the modified preferred embodiment of the third preferred embodiment exhibits the same function and advantageous effects as those of the third preferred embodiment.

Fourth Preferred Embodiment

Figure 29:
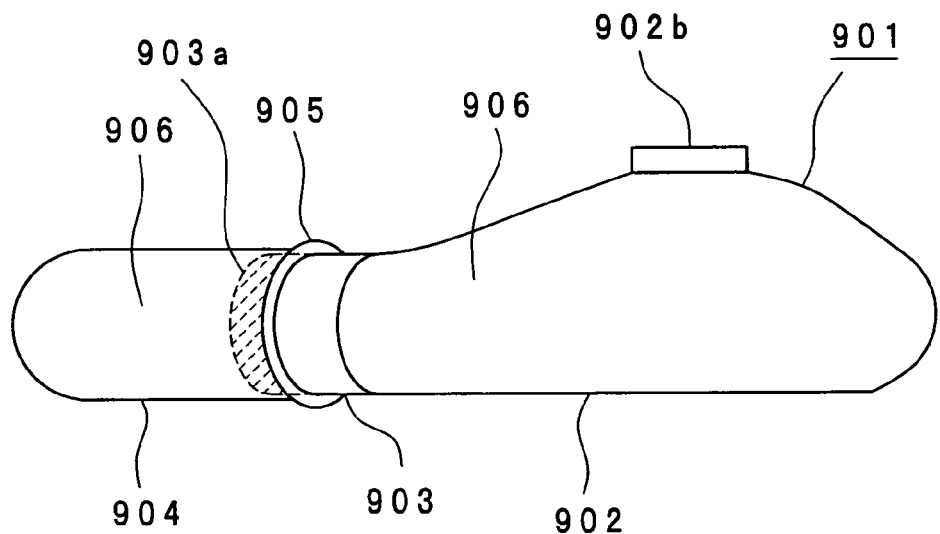
FIG. 29 is a perspective view which illustrates an appearance of a finger phantom apparatus 901 according to a fourth preferred embodiment of the present invention.
Figure 30:
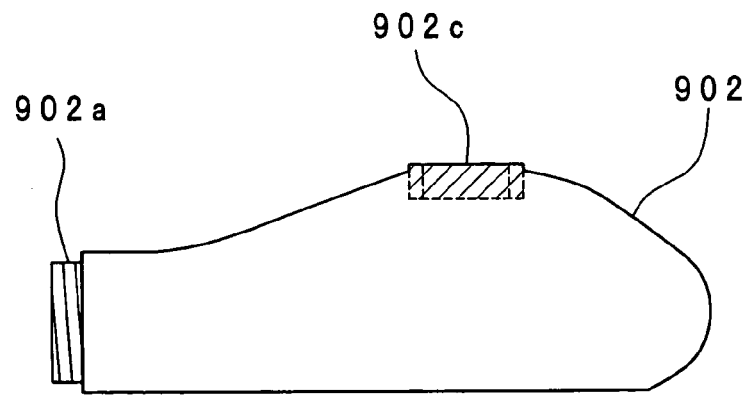
FIG. 30 is a side view which illustrates a configuration of a finger phantom root section 902 shown in FIG. 29.
Figure 31:
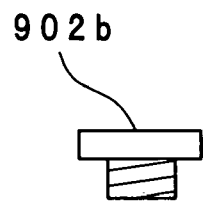
FIG. 31 is a side view which illustrates a configuration of a screw section 902b engaged with a screw reception section 902c of the finger phantom root section 902 shown in FIG. 30.
Figure 32:
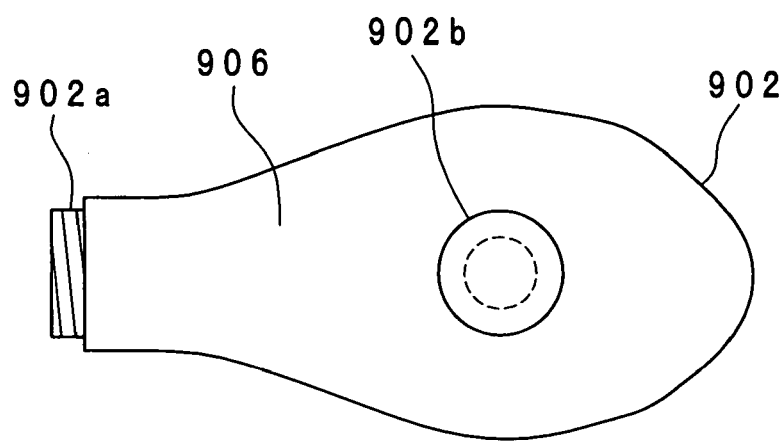
FIG. 32 is a top view which illustrates a configuration of the finger phantom root section 902 shown in FIG. 30.
Figure 33:
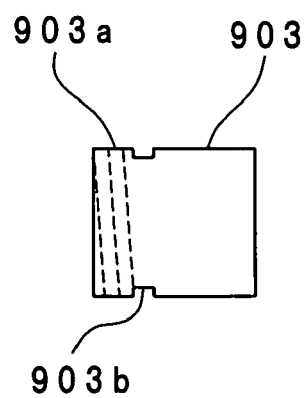
FIG. 33 is a side view which illustrates a configuration of a circular cylindrical member 902 shown in FIG. 29.

FIG. 29 is a perspective view which illustrates an appearance of a finger phantom apparatus 901 according to a fourth preferred embodiment of the present invention. FIG. 30 is a side view which illustrates a configuration of a finger phantom root section 902 shown in FIG. 29. FIG. 31 is a side view which illustrates a configuration of a screw section 902b engaged with a screw reception section 902c of the finger phantom root section 902 shown in FIG. 30. FIG. 32 is a top view which illustrates a configuration of the finger phantom root section 902 shown in FIG. 30. FIG. 33 is a side view which illustrates a configuration of a circular cylindrical member 902 shown in FIG. 29. The finger phantom apparatus 901 according to the fourth preferred embodiment simulates a thumb, and is characterized by including the hollow finger phantom root section 902, the hollow circular cylindrical member 903, and the hollow fingertip section 904 having a container made of an elastic material such as rubber or the like.

A physiological saline solution 906 is filled into the finger phantom root section 902 having the screw section 902a provided on a left tip end. The screw section 902b formed at the highest position on an upper end portion of the finger phantom root section 902 is screwed with the screw reception section 902c serving as an injection hole for injecting the physiological saline solution 906. In addition, the screw section 902a is provided on the left side end portion of the finger phantom root section 902. Further, a screw reception section 903a is provided on a right side end portion of the hollow circular cylindrical member 903 made of resin such as acryl or polypropylene. A small ring-shaped groove having a diameter smaller than an outside diameter of the circular cylindrical member 903 is formed in a finger fixing section 903b in the vicinity of the screw reception section 903a.

Referring to FIG. 29, by fitting a ring-shaped stopper 905 into this groove on through the fingertip section 904, the fingertip section 904 is fixed to the circular cylindrical member 903 by the stopper 905. In addition, the physiological saline solution 906 is filled into the fingertip section 904 and the circular cylindrical member 903, then the finger phantom root section 902 is inserted into the circular cylindrical member 903, and the screw section 902a is screwed with the screw reception section 903a, and this leads to that the finger phantom apparatus 901 is sealed.

Figure 34:
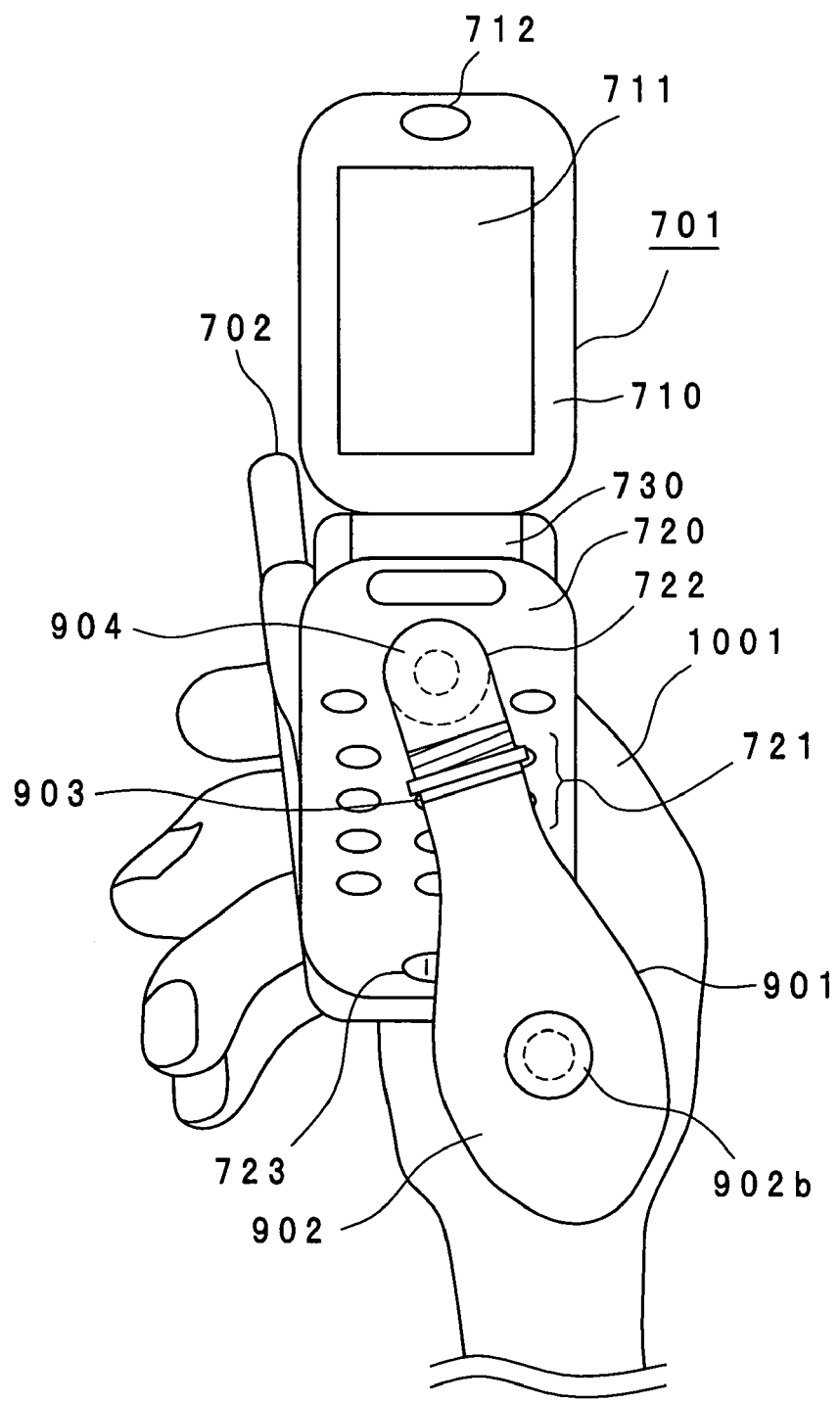
FIG. 34 is a front view which illustrates such a state that a folding portable radio communication apparatus 701 is held by the finger phantom apparatus 901 shown in FIG. 29 and a hand section 1001 of hand phantom, so that a lower housing 720 of the portable radio communication apparatus 701 is sandwiched between the finger phantom apparatus 901 and the hand section 1001 of hand phantom when a keypad section 721 serving as an input means and provided on the lower housing 720 of the portable radio communication apparatus 701 is pressed by the finger phantom apparatus 901.

FIG. 34 is a front view which illustrates such a state that a folding portable radio communication apparatus 701 is held by the finger phantom apparatus 901 shown in FIG. 29 and a hand section 1001 of hand phantom, so that a lower housing 720 of the portable radio communication apparatus 701 is sandwiched between the finger phantom apparatus 901 and the hand section 1001 of hand phantom when a keypad section 721 serving as an input means or an input device and provided on the lower housing 720 of the portable radio communication apparatus 701 is pressed by the finger phantom apparatus 901.

Referring to FIG. 34, by holding the folding portable radio communication apparatus 701 constituted in a manner similar to that of FIG. 25 by the finger phantom apparatus 901 constituted as mentioned above and the hand section 1001 of hand phantom, so that the lower housing 720 of the portable radio communication apparatus 701 is sandwiched between the finger phantom apparatus 901 and the hand section 1001 of hand phantom when a key 722 serving as the input means and provided on the lower housing 720 of the portable radio communication apparatus 701 is pressed by the fingertip section 904 of the finger phantom apparatus 901, it is possible to highly accurately simulate such a state that E-mails or the like are actually transmitted and received using the portable radio communication apparatus 701, to ensure good reproducibility, and measure the characteristics of the antenna with higher accuracy. Further, by using a hand section including the hand section 1001 of hand phantom and the finger phantom apparatus 901 as right fingers of the human phantom apparatus described in the preceding preferred embodiments, it is possible to simulate a PDA attitude more faithfully, and to measure the characteristics of the antenna with accuracy higher than that of the prior art.

Modified Preferred Embodiments of First to Fourth Preferred Embodiment

In the preferred embodiments mentioned so far, the physiological saline solution 906 is used as the human body equivalent material. However, the present invention is not limited to this. The water or the SAR solution may be used instead of the physiological saline solution 906 as mentioned above.

The finger phantom apparatus according to each of the third preferred embodiment, the modified preferred embodiment thereof, and the fourth preferred embodiment may be used in the human phantom apparatus according to the first preferred embodiment or to the antenna characteristic measurement system according to the second preferred embodiment.

In the preferred embodiments mentioned so far, the portable radio communication apparatus is used. However, the present invention is not limited to this. The present invention may be applied to various types of radio communication apparatuses.

As mentioned so far, the human phantom apparatus according to the present invention is a human phantom apparatus including: a body section, a head section connected with the body section, at least one shoulder section connected with the body section. and an arm section connected with the at least one shoulder section and including a hand section. In this case, each of the body section, the head section, the at least one shoulder section, and the arm section filled with a human body equivalent material, and the human phantom apparatus has an attitude of holding a radio communication apparatus by the hand section of the arm section, so that the human phantom apparatus looks at a display unit of the radio communication apparatus in front of the body section.

Accordingly, it is possible to faithfully simulate such a state that the radio communication apparatus is held in a PDA attitude, and to measure the characteristics of the antenna with accuracy higher than that of the prior art by measuring an antenna of the radio communication apparatus using this human phantom apparatus.

Further, by designing dimensions of inner walls of respective sections of the human phantom apparatus based on standard dimensions of an adult male according to predetermined statistic data, it is possible to measure the characteristics of the antenna having a larger universality.

The human phantom apparatus is provided as a liquid phantom having a physiological saline solution, water, or an SAR solution filled into a dielectric container made of resin or the like. In this case, even if various frequencies are used, the characteristics of the antenna of the radio communication apparatus 111 can be measured only by filling a physiological saline solution, water, or an SAR solution according to electric properties of a human body at the respective frequencies. In addition, it is possible to greatly reduce the manufacturing cost as compared with that of a solid phantom made of a solid material.

By making the position and the angle when the radio communication apparatus is held adjustable by the sliding mechanism, it is possible to measure the radiation characteristics of the antenna using the interval between the radio communication apparatus and the human phantom apparatus and the inclined angle of the radio communication apparatus as parameters. In addition, the attitude of the display unit of the radio communication apparatus can be adjusted to always face or oppose to the head section of the human phantom apparatus, so that the human phantom apparatus looks at the display unit. Therefore, it is possible to measure the characteristics of the antenna of the radio communication apparatus with accuracy higher than that of the prior art.

Further, when a plurality of antennas is arranged in the radio communication apparatus, the respective antennas are arranged so that an absolute value of the difference between intervals "d1" and "d2" between the antennas and the body section of the human phantom apparatus, respectively, is $\lambda/4$ or a value obtained by adding a multiple of a natural number of $\lambda/2$ to $\lambda/4$, in such a state that the radio communication apparatus is held so as to be inclined at a predetermined inclined angle, and so that the antenna having a higher reception level in a propagation environment within a line of sight is selected as a transmission antenna. In this case, it is possible to improve the diversity effect and to suppress deterioration of antenna sensitivity in the PDA attitude.

Moreover, by employing the finger phantom apparatus having a container made having a tip end portion made of an elastic material such as rubber, it is possible to highly accurately simulate such a state that the finger contacts with the antenna or the radio communication apparatus, and to measure the characteristics of the antenna with accuracy higher than that of the prior art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An antenna characteristic measurement apparatus for measuring a characteristic of an antenna of a radio communication apparatus using a human phantom apparatus,
   wherein said human phantom apparatus comprises:
   a body section;
   a head section connected with said body section;

at least one shoulder section connected with said body section; and an arm section including a hand section, said arm section connected with said shoulder section, wherein each of the body section, the head section, the at least one shoulder section, and the arm section is filled with a human body equivalent material, wherein the human phantom apparatus has an attitude of holding a radio communication apparatus by the hand section of said arm section, so that the human phantom apparatus looks at a display unit of the radio communication apparatus in front of said body section, wherein said antenna characteristic measurement apparatus comprises a control device for measuring the characteristic of the antenna of the radio communication apparatus, by changing at least one parameter selected from (a) an interval between said body section and the radio communication apparatus, (b) an inclined angle of the radio communication apparatus with respect to a horizontal direction, and (c) a height of the radio communication apparatus, wherein said human phantom apparatus comprises a finger phantom apparatus, and wherein said finger phantom apparatus comprises:

a hollow fingertip section made of an elastic material; and a hollow finger root section made of a dielectric material, wherein said fingertip section and said finger root section are filled with a human body equivalent material, and are sealed.

2. The antenna characteristic measurement apparatus as claimed in claim 1, wherein the characteristic of the antenna of said radio communication apparatus is measured in such a state that said fingertip section is brought into contact with an input device of said radio communication apparatus.

* * * * *